(12) United States Patent
Nimbalker et al.

(10) Patent No.: US 10,541,781 B2
(45) Date of Patent: Jan. 21, 2020

(54) RATE MATCHING USING LOW-DENSITY PARITY-CHECK CODES

(71) Applicant: Intel IP Corporation, Santa Clara, CA (US)

(72) Inventors: Ajit Nimbalker, Fremont, CA (US); Tao Xu, Portland, OR (US)

(73) Assignee: Intel IP Corporation, Santa Clara, CA (US)

( * ) Notice: Subject to any disclaimer, the term of this patent is extended or adjusted under 35 U.S.C. 154(b) by 15 days.

(21) Appl. No.: 16/066,655

(22) PCT Filed: Jul. 7, 2016

(86) PCT No.: PCT/US2016/041366
§ 371 (c)(1),
(2) Date: Jun. 27, 2018

(87) PCT Pub. No.: WO2017/131813
PCT Pub. Date: Aug. 3, 2017

(65) Prior Publication Data
US 2019/0013901 A1    Jan. 10, 2019

Related U.S. Application Data

(60) Provisional application No. 62/288,936, filed on Jan. 29, 2019.

(51) Int. Cl.
*H03M 13/00* (2006.01)
*H04L 1/00* (2006.01)
(Continued)

(52) U.S. Cl.
CPC ....... *H04L 1/0058* (2013.01); *H03M 13/1102* (2013.01); *H04L 1/0041* (2013.01); *H04L 1/1896* (2013.01)

(58) Field of Classification Search
CPC ... H04L 1/0058; H04L 1/0041; H04L 1/1896; H04L 1/0042; H04L 1/0057; H04L 1/0059; H04L 1/0061; H04L 1/0063; H04L 1/1825; H04L 1/1822; H03M 13/1102; H03M 13/116; H03M 13/117; H03M 13/1162;
(Continued)

(56) References Cited

U.S. PATENT DOCUMENTS

2009/0147724 A1    6/2009    Nimbalker et al.
2010/0067598 A1    3/2010    Sampath et al.
(Continued)

*Primary Examiner* — Christine T. Tu
(74) *Attorney, Agent, or Firm* — Thorpe North & Western

(57) ABSTRACT

Technology for a transmitter operable to perform data transmissions using low density parity check (LDPC) codes is disclosed. The transmitter can determine soft buffer information (Nsoft) for a receiver. The transmitter can determine a soft buffer partition per HARQ process (NIR) for the UE. The transmitter can obtain, for a transport block, a number of code block segments (C). The transmitter can select a shift size value (z). The transmitter can determine an amount of soft buffer available for the code block segments (Ncb) based on NIR, C, and z. The transmitter can encode the code block segments based on an LDPC coding scheme to obtain encoded parity bits. The transmitter can select a subset of the encoded parity bits based on the determined amount of soft buffer associated with the code block segments.

27 Claims, 10 Drawing Sheets

(51) Int. Cl.
*H03M 13/11* (2006.01)
*H04L 1/18* (2006.01)

(58) Field of Classification Search
CPC ........... H03M 13/165; H03M 13/1171; H03M 13/1174; H03M 13/118; H03M 13/1111
See application file for complete search history.

(56) References Cited

U.S. PATENT DOCUMENTS

| | | | |
|---|---|---|---|
| 2012/0272117 A1* | 10/2012 | Stadelmeier | H04L 1/0071 |
| | | | 714/752 |
| 2013/0223485 A1* | 8/2013 | Bai | H04L 1/0068 |
| | | | 375/219 |
| 2014/0198758 A1 | 7/2014 | Nimbalker et al. | |
| 2018/0026755 A1* | 1/2018 | Meng | H04L 5/006 |
| | | | 370/429 |

* cited by examiner

RATE MATCHING USING LOW-DENSITY PARITY-CHECK CODES

BACKGROUND

Wireless mobile communication technology uses various standards and protocols to transmit data between a node (e.g., a transmission station) and a wireless device (e.g., a mobile device). Some wireless devices communicate using orthogonal frequency-division multiple access (OFDMA) in a downlink (DL) transmission and single carrier frequency division multiple access (SC-FDMA) in uplink (UL). Standards and protocols that use orthogonal frequency-division multiplexing (OFDM) for signal transmission include the third generation partnership project (3GPP) long term evolution (LTE), the Institute of Electrical and Electronics Engineers (IEEE) 802.16 standard (e.g., 802.16e, 802.16m), which is commonly known to industry groups as WiMAX (Worldwide interoperability for Microwave Access), and the IEEE 802.11 standard, which is commonly known to industry groups as WiFi.

In 3GPP radio access network (RAN) LTE systems, the node can be a combination of Evolved Universal Terrestrial Radio Access Network (E-UTRAN) Node Bs (also commonly denoted as evolved Node Bs, enhanced Node Bs, eNodeBs, or eNBs) and Radio Network Controllers (RNCs), which communicates with the wireless device, known as a user equipment (UE). The downlink (DL) transmission can be a communication from the node (e.g., eNodeB) to the wireless device (e.g., UE), and the uplink (UL) transmission can be a communication from the wireless device to the node.

BRIEF DESCRIPTION OF THE DRAWINGS

Features and advantages of the disclosure will be apparent from the detailed description which follows, taken in conjunction with the accompanying drawings, which together illustrate, by way of example, features of the disclosure; and, wherein.

Figure 1:
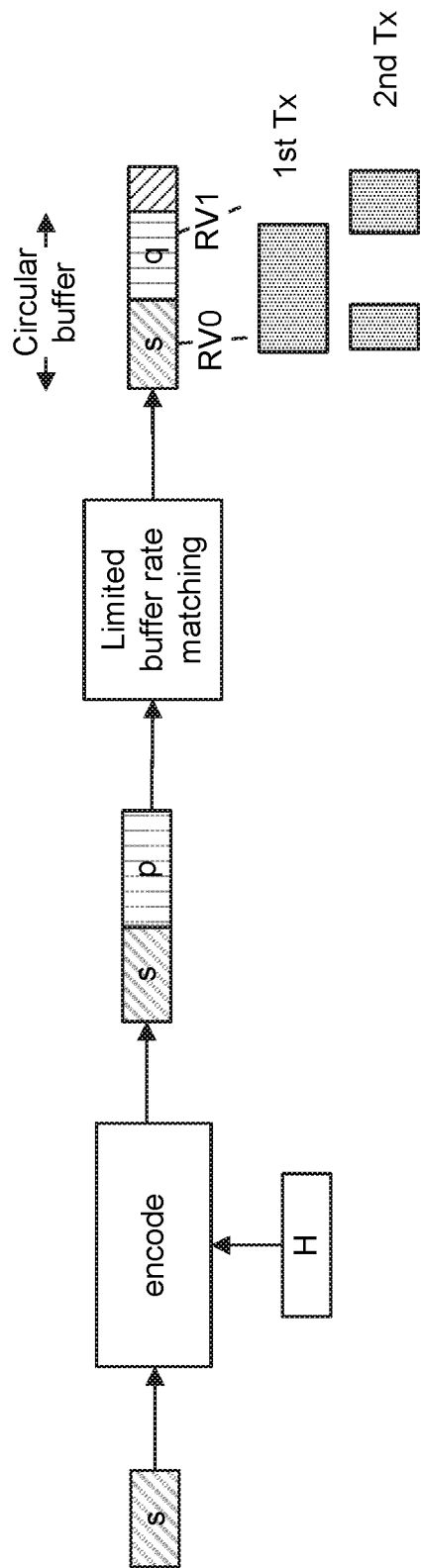
FIG. 1 illustrates a transmitter operable to encode code block segments using a low-density parity check (LDPC) coding scheme and select bits for transmission using limited buffer rate matching (LBRM) in accordance with an example.

Reference will now be made to the exemplary embodiments illustrated, and specific language will be used herein to describe the same. It will nevertheless be understood that no limitation of the scope of the technology is thereby intended.

DETAILED DESCRIPTION

Before the present technology is disclosed and described, it is to be understood that this technology is not limited to the particular structures, process actions, or materials disclosed herein, but is extended to equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating actions and operations and do not necessarily indicate a particular order or sequence.

Example Embodiments

An initial overview of technology embodiments is provided below and then specific technology embodiments are described in further detail later. This initial summary is intended to aid readers in understanding the technology more quickly but is not intended to identify key features or essential features of the technology nor is it intended to limit the scope of the claimed subject matter.

Information can be transmitted from a transmitter to a receiver over a communication channel. Noise inherent in the communication channel can produce errors in transmitted information. To mitigate the effect of noise in the communication channel, redundancy can be included in the transmission, and the redundancy can enable the receiver to accurately reconstruct original information despite the noise in the communication channel. The redundancy allows the receiver to detect a limited number of errors that can occur during transmission, and often to correct these errors without retransmission.

A number of possible coding schemes can be used for determining an amount and nature of the redundancy to include in the transmitted information. The redundancy can be in the form of redundant bits, which are added to the transmitted information. The coding schemes can vary depending on the desired level of error correction, decoding complexity, the ability to locate/correct or recover from the errors, the ability to correct burst errors, and other various characteristics. In addition, a number of codes can be available for a particular coding scheme, wherein the codes can vary in terms of the number of information bits and the number of redundant bits (or sometimes also known as parity bits). The codes can be systematic or non-systematic. With respect to systematic codes, redundant bits can be added to, for example, the end of a stream of information bits. With respect to non-systematic codes, some or all of the information bits may not be present in a transmitted bit stream.

The coding scheme and actual codes can be selected for use based on various criteria. For example, these criteria include an expected block error rate (BLER) of the transmission system, a desired BLER, an amount of transmission overhead associated with a particular code, an amount of processing to process the code, etc. In addition, a maximum fraction of errors (or missing bits that can be corrected) can be determined based on the coding scheme used, so different coding schemes can be suitable for different conditions.

One exemplary code that can be used for encoding and decoding information in a noisy communication channel is a low-density parity-check (LDPC) code. LDPC codes are error correcting codes (i.e., codes that can be used for forward error correction or channel coding). In other words, the transmitter can encode data in a redundant manner using an LDPC code, and the receiver can decode the data using the LDPC decoding algorithm (e.g., belief propagation) such that any errors in the transmission are corrected. LDPC codes are parity check codes with a parity check matrix containing binary 0s and 1s. The parity check matrix can be defined in terms of a matrix dimension (e.g., information block length and number of parity-checks), a number of is per column, and a number of 1s per row. The 1s in the parity check matrix can be randomly distributed within the parity check matrix. For efficient encoding/decoding, the parity check matrix can be formed using submatrices having only a single 1 per column and per row. Therefore, for a given code, a number of parity check matrixes can be formed with varying block lengths by selecting different dimensions for the submatrices.

In one example, the 3GPP LTE standard (e.g., Release 13 and earlier) supports an adaptive modulation and coding scheme (MCS) with a supported set of resource allocations, modulation and coding schemes, packet sizes (or transport block sizes), and rate-compatible channel coding. The rate-compatible channel coding can be based on a turbo code with circular buffer rate-matching for incremental redundancy (IR) hybrid automatic repeat request (HARQ) support. A supported set of spectral efficiencies can range from 0.1 bits per second per Hertz (bps/Hz) up to 7.6 bps/Hz (for 256-QAM) with MCS levels defined corresponding to approximately 1 decibel (dB) step sizes. This can be achieved based on rate-compatible channel coding to encode a packet (or transport block) at an arbitrary coding rate according to a selected MCS level, and defining multiple redundancy versions to support HARQ operation.

In one example, with respect to IR HARQ, each retransmission may not be identical to a previous transmission. Rather, multiple sets of coded bits can be generated and whenever a retransmission is necessitated, the retransmitted data can represent a different set of coded bits than the previous transmission. A receiver can combine the retransmission with previous transmission attempts of the same packet. As the retransmission can include additional parity bits which are not included in the previous transmission attempts, the resulting code rate is generally lowered by subsequent retransmissions. In addition, each transmission can include a different set of parity bits, which can result in a higher coding gain.

In one example, with an LDPC-based incremental redundancy (IR) scheme (as opposed to using turbo codes as in existing 3GPP LTE systems), there can be potential benefits in taking into account the LDPC code structure into the HARQ design. In cellular systems, a user equipment (UE) soft memory can support multiple HARQ processes at the UE. The UE soft memory can be specified for a given peak data supported by the UE (e.g., based on a UE category indication or UE capability information). Since the underlying channel coding scheme can support incremental redundancy going down to a lower code rate (e.g., 1/3 or 1/6), this can lead to increased UE soft buffer storage, thereby increasing UE implementation complexity via an increased gate count, etc. Therefore, limited buffer rate-matching is desirable. The UE soft buffer storage limitations can be relaxed by allowing an eNodeB to transmit larger data packets (e.g., transport block) using a higher coding rate.

In one example, the present technology relates to UE soft buffer management and redundancy versions with LDPC codes. With respect to incremental-redundancy (IR) based LDPC codes, a UE soft buffer size can be determined for limited buffer rate matching. The UE soft buffer size is the amount of memory the receiver (e.g., UE) assigns for storing packets. In addition, redundancy versions can be selected for circular buffer rate matching. The redundancy version is an indicator of different portions of a code word. For example, a first subset of coded bits can be selected for transmission. If the packet is not successfully received at the receiver, the transmitter (e.g., eNodeB) can select a second subset of coded bits for transmission. The receiver can combine coded bits from the two separate transmissions, and then decode the combined (or aggregated) coded bits. In addition, the determination of the UE soft buffer size and the selection of the redundancy version can be matched to a shift size used for the LDPC code during encoding at the transmitter.

In one example, structured LDPC codes have been adopted in wireless technology standards, such as IEEE802.11n, IEEE802.11ac, and IEEE802.11ad. Structured LDPC codes based on shifted identity matrices can allow for vectorized operations that facilitate high throughput encoding and decoding. In addition, structured LDPC codes provide a framework to support a wide range of block sizes and code rates.

In one example, a LDPC code can have a codeword length $n=z \cdot n_b$, an information block $k=z \cdot k_b$, and a shift size or subblock size z, wherein $n_b$ is a number of code bits and $k_b$ is a number of information bits. The LDPC code can have a code rate $r=k/n=k_b/n_b$, where the matrix prototype (as defined below) for the LDPC code has dimensions $n_b-k_b \times n_b$. An LDPC encoder can encode an information block $i=i_0, i_1, i_2, \ldots, i_{k-1}$ into a codeword c, of size n, where $c=(c_0, c_1, \ldots c_{k-1}, c_k \ldots c_{n-1})$. In systematic encoding, the first k bits of the codeword are typically the same as the information bits, i.e., $c_j=i_j$, for $j=0$ to $k-1$. The codeword c satisfies the parity-check equation $H \cdot c^T=0$, where H is an n-k×n parity-check matrix. In other words, the LDPC code can have a particular code rate, and for a given number of information bits, parity check bits can be added to the information bits. The parity check bits can be obtained by solving the parity check equation ($H \cdot c^T=0$). In one example, the first k columns (or $k_b$) of the parity-check matrix can be referred to as systematic columns, and the remaining n-k columns (or $n_b-k_b$) can be referred to as parity columns. For the parity-check matrix, each column has a column weight, which denotes the number of 1's in the column, and each row has a row weight, which denotes the numbers of 1's in the row.

In one example, in these structured LDPC codes, each parity check matrix can be partitioned into square blocks, or sub matrices, of size z×z, wherein z is an integer. These sub matrices can be cyclic permutations of an identity matrix (or shifted identity matrix) or null matrices. A cyclic permutation matrix $P_i$ can be obtained from the z×z identity matrix by cyclically shifting the columns to the right by i elements.

Three different exemplary sub-matrices are shown below ($P_0$, $P_4$ and $P_2$). The matrix $P_0$ is a z×z identity matrix, wherein z=5. The matrix $P_0$ is shifted right by a value of 0. The matrix $P_4$ indicates an identity matrix that is shifted right by a value of 4. In other words, each row of matrix $P_0$ is rotated cyclically by 4 to yield $P_0$. Similarly, $P_2$ is shifted right by a value of 2. Thus, each row of matrix $P_0$ is rotated cyclically by 2 to yield $P_2$. In addition, a null matrix can be used when every element of the sub matrix is 0.

$$P_0 = \begin{bmatrix} 1 & 0 & 0 & 0 & 0 \\ 0 & 1 & 0 & 0 & 0 \\ 0 & 0 & 1 & 0 & 0 \\ 0 & 0 & 0 & 1 & 0 \\ 0 & 0 & 0 & 0 & 1 \end{bmatrix},$$

$$P_4 = \begin{bmatrix} 0 & 0 & 0 & 0 & 1 \\ 1 & 0 & 0 & 0 & 0 \\ 0 & 1 & 0 & 0 & 0 \\ 0 & 0 & 1 & 0 & 0 \\ 0 & 0 & 0 & 1 & 0 \end{bmatrix},$$

$$P_2 = \begin{bmatrix} 0 & 0 & 1 & 0 & 0 \\ 0 & 0 & 0 & 1 & 0 \\ 0 & 0 & 0 & 0 & 1 \\ 1 & 0 & 0 & 0 & 0 \\ 0 & 1 & 0 & 0 & 0 \end{bmatrix}$$

In one example, a matrix H_r89_z96 is shown below.
31 1 0 - 76 45 29 - - 20 45 90 2 - 29 24 23 13 43 38 1 74 10 70 18 14 48 16 5 65 90 88 1 0 - -
20 - 40 15 - 51 38 49 36 - 28 91 30 92 - 15 13 24 91 59 13 37 7 26 94 18 58 8 42 95 42 14 - 0 0 -
- 87 33 27 2 - 27 76 22 11 - 3 28 82 23 - - 37 62 40 77 55 18 78 22 37 95 48 71 9 87 36 0 - 0 0
0 34 - 18 23 8 - 61 87 30 17 - - 65 38 0 36 25 58 61 19 35 65 9 90 72 13 8 55 15 86 59 1 - - 0

The matrix H_r89_z96 is for a coding rate of 8/9 with a sub matrix dimension (or z) that is equal to 96 and a code word length equal to 3456. In the matrix H_r89_z96, each non-negative integer i denotes the cyclic permutation matrix $P_i$ and negative integer entries (−1) or null entries (−) denote null or zero submatrices. The matrix H_r89_z96 has 4 rows and 36 columns. To achieve a code rate of 8/9, the parity-check matrix can encode an information size of 32*96 to get a codeword of 36*96 of which 32*96 are information bits, and 4*96 are codeword bits. In this case, $n_b$=36, $k_b$=32 and $n_b-k_b$=4. The first entry in the matrix H_r89_z96 is 31. The 31 is akin to $P_{31}$. In other words, a 96×96 identity matrix is shifted to the right by a value of 31, and this sub matrix corresponds to the 31 in the matrix H_r89_z96. Similarly, the second entry in the matrix H_r89_z96 is 1, which indicates that the 96×96 identity matrix is rotated to the right by a value of 1, and this sub matrix corresponds to the 1 in the matrix H_r89_z96. The matrix H_r89_z96 can be referred to as a matrix prototype. The matrix prototype is essentially used as a short hand notation.

FIG. 1 illustrates an example of a transmitter operable to encode code block segments using a low-density parity check (LDPC) coding scheme and select bits for transmission using limited buffer rate matching (LBRM). The transmitter can be an eNodeB. An information block or systematic portion (denoted by S) can be encoded based on an LDPC parity check matrix (H), wherein the LDPC parity check matrix can be a prototype matrix. The systematic portion (s) can be encoded based on the LDPC parity check matrix (H) to obtain a code word, which can be denoted as [s p]. Here, p can denote the parity check bits. Thus, an output of the encoder is the encoded bits (or code word). The code word [s p] can be provided to a limited buffer rate-matching function, which can shorten the code word based on an amount of soft memory available at a receiver (e.g., UE). In other words, the code word can be shortened based on a UE soft buffer size.

In one example, the code word (which has been shortened) can be provided to a circular buffer. The circular buffer can include contents represented as [s q], wherein s denotes the systematic portion and q denotes a subset of the parity check bits (i.e., a subset of p). In other words, the code word can be shortened by creating the circular buffer, which is shorter than a size of the code word. In addition, the cross-lines illustrated at the end of [s q] denote a subset of parity check bits that are not transmitted and may not be stored in the UE soft buffer. In other words, even if the transmitter sends these parity check bits to the receiver, the receiver may not be able to store the parity check bits in memory.

In one example, a first portion of bits (from the shortened code word) can be selected for a first transmission. For the first transmission, a first redundancy version can be defined (RV0). The first redundancy version (RV0) can indicate a starting point in the circular buffer, and encoded bits (i.e., bits of the shortened code word) for transmission can be read contiguously from the starting point (and possibly wrap around to a beginning of the circular buffer when an end of the circular buffer is reached). In other words, the first redundancy version (RV0) can point to a beginning of the circular buffer, and based on the starting point and a desired rate, encoded bits can be selected from the circular buffer for the first transmission. In one example, the first transmission may not be successfully received at the receiver (i.e., the first transmission fails). In this case, a second portion of bits (from the shortened code word) can be selected for a second transmission. For the second transmission, a second redundancy version can be defined (RV1). The second redundancy version (RV1) can be similar to the first redundancy version (RV0). In other words, the second redundancy version (RV1) can provide another starting point in the circular buffer, and encoded bits (i.e., bits of the shortened code word) for transmission can be read contiguously from the starting point and if an end is reached, encoded bits from the beginning of the circular buffer can be read, and these encoded bits may form the second transmission. The receiver may receive and decode the first and second transmissions appropriately.

As shown in FIG. 1, when the first transmission fails, a different set of encoded bits can be selected for the second transmission. In other words, the encoded bits selected from the circular buffer for the first transmission may not be exactly the same as the encoded bits selected from the circular buffer for the second transmission. However, there may be some overlap between the encoded bits selected for the first transmission and the second transmission, respectively. For example, in the second transmission, there may be a slight overlap in the first portion, but no overlap in the later portion of the parity bits. This allows for maximum use of all available coded bits. In the second transmission, some new coded bits can be sent over the channel, which can allow for more efficient use of the parity bits. For example, the first transmission can be at a high code rate, such that a relatively small number of parity bits can be sent from the transmitter. In this case, a relatively small number of parity bits can be sent from the transmitter. For the second transmission, the transmitter can send a new set of parity bits. This lowers an effective code rate, such that additional parity bits are available for decoding, thereby improving performance. If the first transmission and the second transmission were to include the same encoded bits, an energy gain can be achieved, but no coding gain may be achieved. On the other hand, when the coded bits are different for the first and second transmissions, both an energy gain and a coding gain can be achieved.

In one example, with respect to incremental redundancy and structured LDPC codes, the ending point can be an arbitrary value when limited buffer rate-matching is used. For example, it may be desirable to adjust the ending point, such that a resulting buffer size is aligned with the structure of the LDPC code.

Figure 2:
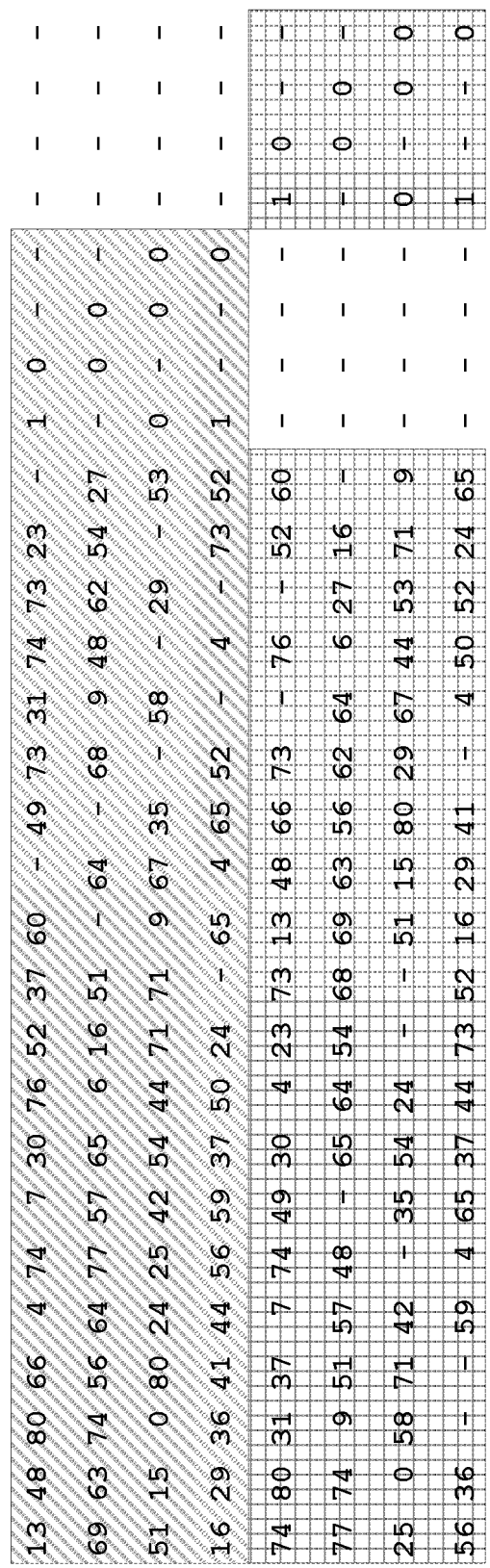
FIG. 2 illustrates a parity check matrix in accordance with an example.

FIG. 2 illustrates an example of an extended parity check matrix (H). A rate rate-5/7 code can be obtained using a cascaded H-matrix structure. The portion of the extended parity check matrix (H) indicated using slanted lines can indicate $H_1$, and the portion of extended parity check matrix (H) indicated using checkered lines can indicate an encoding with a permuted $H_1$. The portion of $H_1$ can denote a parity-check matrix from 802.11n for rate-5/6 and z=81. The portion of $H_1$ can have dimensions of 4 rows and 24 columns. The first 20 columns can represent systematic bits (s) and the following 4 columns can represent parity check bits (p). The interleaving can be performed on a vectorized input. For example, the permutation can be designed using a parity check matrix parameter, such as z, wherein z is an expansion factor or parallelism factor or shift vector size associated with the parity-check matrix. In the portion indicating the encoding with the permuted $H_1$, an additional 4 columns of new parity check bits can be added.

In addition, an extended parity check matrix of code rate-5/7 can be generated using the following notation:

$$H = \begin{bmatrix} H_1(:,1:k) & H_1(:,k+1:n) & 0 \\ H_1(:,\pi(1:k)) & 0 & H_1(:,k+1:n) \end{bmatrix},$$

wherein a permutation is given by n=[6 3 16 11 7 17 14 8 5 19 15 1 2 4 18 13 9 20 10 12] and $H_1$.

Figure 3:
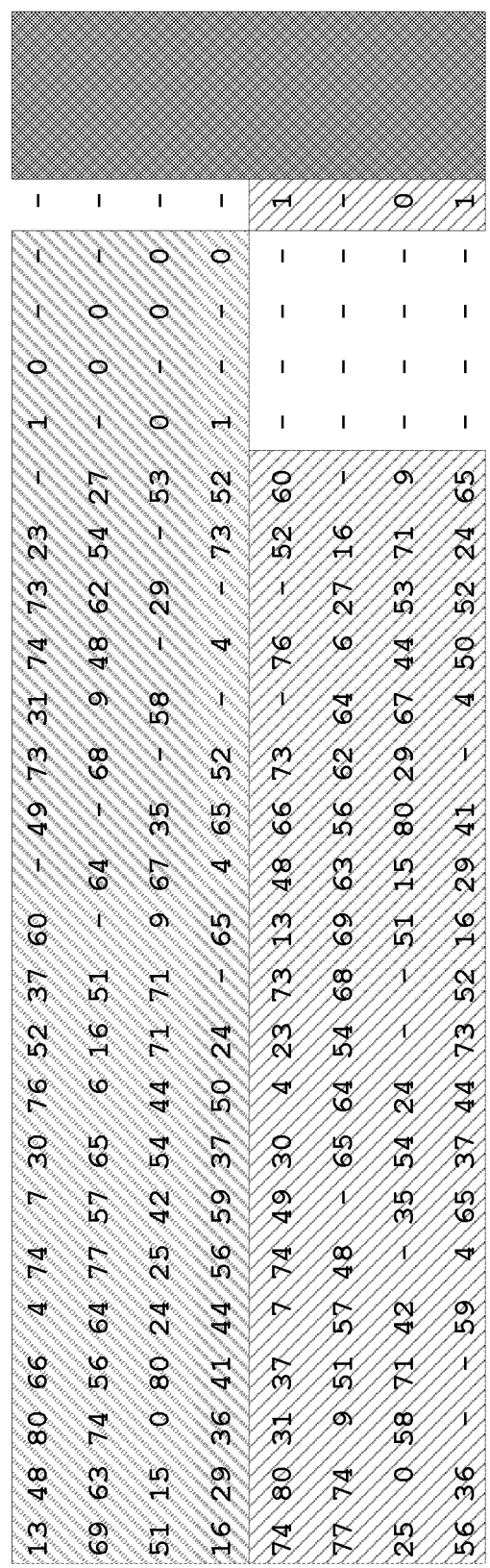
FIG. 3 illustrates a parity check matrix on which limited buffer rate matching (LBRM) is applied in accordance with an example.

FIG. 3 illustrates an example of a parity check matrix on which limited buffer rate matching (LBRM) is applied. When limited buffer rate matching is performed, all of the parity bits are not transmitted, but rather the parity bits are shortened based on a partition size. As shown in the example of FIG. 3, the last 3 columns can be deleted, such that the corresponding coded bits are not transmitted from a transmitter to a receiver.

In one example, when the limited buffer rate-matching is performed, the effective parity-check matrix post-LBRM may be aligned with the structured code boundary (e.g., the boundary may be multiples of shift vector size z). As shown in the example of FIG. 3, the effective parity-check matrix post-LBRM can be aligned with the shift size, which allows an implementation to use a shorter structured code during the decoding process. However, in some cases, the effective parity check matrix after limited buffer rate matching is performed may not always be aligned with the vector shift size (z). Rather, the number of columns that are deleted can be a function of the partition size and a code word size. When the vector boundary is not aligned, the parity check matrix can be slightly longer and zeros can be filled for corresponding coded bits that are not transmitted to the receiver.

In one example, when the effective parity-check matrix post-LBRM is not aligned with the shift vector size (z), a decoder can use a slightly longer structured code, as well as determine a number of log-likelihood ratios (LLRs) to be set to zero. Similar concepts apply to cases where the additional parity-bits are generated using a single-parity-check matrix or other forms of parity-check matrix extensions to support incremental redundancy (IR) functionality.

For example, a single parity-check-based H matrix can be as follows:

$$H = \begin{bmatrix} H_1(:,1:k) & H_1(:,k+1:n) & 0 \\ H_2 & 0 & H_3 \end{bmatrix},$$

wherein $H_3$ is a matrix with diagonal entries that are non-zero (e.g., such as weight-1 parity columns) and this a parity-check portion corresponding to information bits.

In one configuration, the transport block and rate matching can be defined based on the UE soft buffer. The UE soft buffer (or soft memory) can be specified for a given peak data rate supported by the UE (e.g., based on UE category indication or UE capability information). Since the underlying channel coding scheme (e.g., LDPC) can support incremental redundancy going down to a lower code rate (e.g., 1/3 or 1/6), this can lead to increased UE soft buffer storage, which can impact UE implementation complexity. Therefore, limited buffer rate-matching can be supported in cellular systems, wherein the UE soft buffer storage limitations are relaxed by allowing an eNodeB to transmit larger data packets (e.g., transport block) using a higher coding rate, as well as support peak rates without increasing UE complexity.

In one example, the transport block (or data packet) can be provided from a medium access control (MAC) layer to a physical layer for transmission. The transport block can be processed using a multiplexing and coding procedure prior to transmission. The procedure can involve attaching a cyclic redundancy check (CRC) to the transport block. After CRC attachment, code block segmentation can be performed (and possibly code block CRC attachment). The transport blocks can be relatively large in size, but the LDPC channel codes can have limited sizes. For example, the LDPC can support an information size of 3000 bits, but the transport block can be 60,000 bits. In this case, the transport block can be segmented into multiple smaller packets or code blocks, and each code block can be encoded by a separate LDPC encoder and processed on a per code block basis. Moreover, the procedure can include encoding using a channel coder, rate-matching to obtain a circular buffer, selecting bits for transmission from the circular buffer based on one or more redundancy version(s), and mapping the selected bits onto modulation symbols with potential scrambling. Some of these steps can be performed on a per-code block segment basis for efficient pipelining. For example, the encoding, rate matching, selection of bits for transmission from the circular buffer, mapping into modulation symbols with scrambling, etc. can be performed on a per code block basis. Finally, the selected bits can be concatenated and then transmitted from a transmitter (e.g., eNodeB) to a receiver (e.g., UE).

In a non-limiting example, a transport block can be transmitted using an LDPC code. A rate-1/3 LDPC code based off WiFi rate-5/6 code can be defined. Three information block sizes can be supported in accordance with the following: 20*z, wherein z is {27, 54, 81}, which is equal to 540,1080, and 1620 bits. The 27, 54 and 81 represent three different shift sizes, or dimensions of the parity check sub block matrix. The transport block can be associated with a CRC of 24 bits. In this example, there is no additional code block CRC attachment. The transport block can be segmented into smaller pieces (e.g., code block segments), such that each piece can be encoded via the underlying LDPC code.

In one example, there are can be 16 HARQ processes associated with a component carrier, and each HARQ process can have its own transport block. A reference number of HARQ processes can be a maximum number of HARQ processes supported for reception by the UE on the component carrier, or the reference number of HARQ processes can be a fixed value that can be defined in a specification or configured via higher layer signaling. When the transport block (or data packet) is transmitted to the UE, the UE can decode the transport block and send feedback to the eNodeB. When the transmission of the transport block fails, the eNodeB can reschedule a transmission of the transport block. In order to achieve a high data rate for the UE, parallel processes can be created, which are referred to as HARQ processes. In a first time interval, the eNodeB can transmit the transport block on HARQ process 0. In a second time interval, the eNodeB can transmit another transport block on HARQ process 1. As a result, the air interface can be continually occupied, and the UE can obtain the full benefit of the data rate. Otherwise, the UE may only achieve a high data rate a small percentage of the time, so that an experienced data rate can actually be quite small.

In one example, the amount of soft buffer for the UE with respect to the component carrier can be provided by $N_{soft}$. In this example, the amount of soft memory for the UE ($N_{soft}$) can be equal to 1,827,072 bits, which corresponds to a UE category. This UE category can be associated with 150 megabits per second. Therefore, the amount of soft buffer ($N_{soft}$) can indicate the total memory to support HARQ processes at the UE. In this example, with $N_{soft}$ equal to 1,827,072 bits and 16 HAQ processes (which correspond to 16 transport blocks), for each transport block, the maximum amount of soft buffer that is allocatable (assuming an equal split) is $N_{IR}=N_{soft}/16=114,192$ bits. In other words, the amount of soft buffer available at the UE for each HARQ process is 114,192 bits.

In one example, the transport block can have a size of 75,376 bits. A CRC of 24 bits can be added to the transport block to produce a transport block with CRC having a size of 75,400 bits. From this, a number of code blocks can be determined. More specifically, 75,400 bits divided by 1620 bits (which corresponds to an LDPC maximum input size) results in 47 code blocks (C). If each code block is to be encoded using an LDPC code of the same information block size, the number of zero padding bits to be added can be calculated based on the following: 47 code blocks multiplied by 1620 bits minus the transport block size with CRC (i.e., 47×1620−75,400), which equals 740 bits. The zero padding bits can be evenly distributed over all (or some) of the code blocks, or alternatively, the zero padding bits can be introduced in a single code block.

In one example, the amount of soft buffer available per code block ($N_{cb}$) can be calculated by the maximum amount of soft buffer (NO divided by the number of code blocks (C). More specifically, $N_{cb}$ can be determined based on the following equation:

$$N_{cb} = \min\left(z \cdot \left\lfloor \frac{N_{IR}}{C \cdot z} \right\rfloor, K_w\right),$$

wherein $K_w$ indicates a total number of coded bits obtained when the code block segment is encoded using a mother code rate of the LDPC coding scheme.

For the example described above, $N_{cb}$ is equal to 2429 bits. This value can be obtained by rounding to a nearest integer less than or equal to N_IR/C. In other words, for a given code block, 2429 bits can be stored in the UE's soft buffer. Each code block (corresponding to a size of 1620 bits) can be encoded (using a rate-1/3 LDPC code) to produce $K_w$. In this example, $K_w$ can be calculated by multiplying 1620 bits by 3 (based on the rate 1/3 LDPC code), which is equal to 4860 parity check bits or the codeword length is 4860.

However, the buffer limitation can imply that only 2429 bits (approximately 50%) can be stored, which results in an approximately 50% reduction in buffer size. In this example, 2429/81=29.9875, so the soft buffer for the code block does not divide evenly. In this case, the 2429 bits can be adjusted to evenly fit into a number of columns based on the shift size (81 in this example). For example, to obtain more desirable memory configurations (e.g., soft memory stored in blocks of z LLRs), the soft buffer allocation can be adjusted such that the resulting soft buffer size for the code block is 29*81=2349. For single parity-check based design, this can enable the receiver to decode the code block segment using a shortened parity-check matrix with smaller dimensions than the mother parity-check matrix of full dimensions.

In one example, redundancy versions can be defined based on a circular buffer to support HARQ operation. Similar to the above approach for limited buffer rate matching (LBRM), multiple redundancy versions can be defined to align with the shift vector size (z). As a result, the transmitter can start encoding based on a known parity-check portion of the prototype matrix. For example, in the above example, each redundancy version can start at a location within the circular buffer, as indicated by the following:

$$k_0 = \left(z \cdot \left\lceil \frac{N_{cb}}{N_{RV} \cdot z} \right\rceil \cdot rv_{idx}\right)$$

Here, $N_{RV}$ (e.g., 4) is the number of redundancy versions supported, and $k_0$ can align the starting position of the redundancy version to the beginning of one of the vector columns.

In one example, instead of a ceiling function, a floor function or round function can be used. In the above expression, z is a shift size value used with the prototype matrix, and the prototype matrix can be used for encoding the code block segment. For example, with $N_{cb}=2429$, the values of $k_0$ are equal to 0, 648, 1296 and 1944 for the four redundancy versions ($rv_{idx}=0$, 1, 2, 3), respectively. This corresponds to $k_0=81*8*0$, $81*8*1$, $81*8*2$, $81*8*3$. The values of $k_0$ can correspond to column number 0, 8, 16, and 24 in the prototype matrix of the LDPC code used for encoding the code block segment. The redundancy version definition can be defined similarly when a partial-Chase or partial-IR operation is used, and where LBRM may or may not be used. Here, the mother code rate can be higher, and none of the parity-check bits may be based on single-parity-check equations. In this case, a first transmission (using a first redundancy version) can result in most coded bits in the circular buffer being transmitted, except some coded bits used for puncturing. A second transmission (using a second redundancy version) can be defined to enable the transmitter to transmit parity-bits that were not part of the first transmission. As explained below, the second redundancy version for the second transmission can be defined in multiple ways.

Figure 4A:
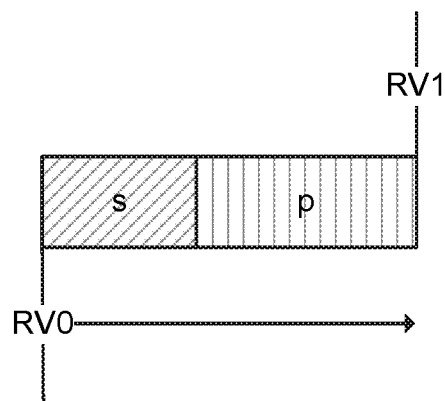
FIG. 4A depicts a redundancy version for a second transmission from a transmitter to a receiver in accordance with an example.

FIG. 4A depicts an example of a redundancy version for a second transmission from a transmitter (e.g., eNodeB) to a receiver (e.g., UE). The second transmission can occur after a first transmission, and the second transmission can include parity bits that were not part of the first transmission. The second transmission (using a second redundancy version) can be defined to start in a reverse order in a circular buffer. Information block or systematic portion can be denoted by S, and parity check bits can be denoted by p.

Figure 4B:
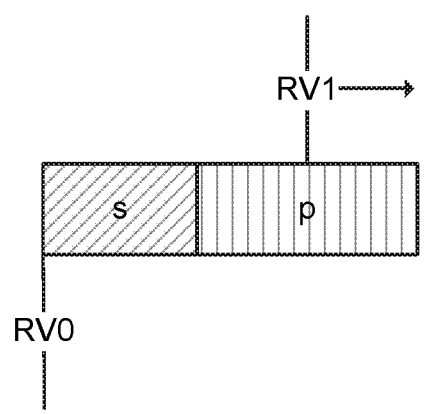
FIG. 4B depicts another redundancy version for a second transmission from a transmitter to a receiver in accordance with an example.

FIG. 4B depicts an example of another redundancy version for a second transmission from a transmitter (e.g., eNodeB) to a receiver (e.g., UE). The second transmission can occur after a first transmission, and the second transmission can include parity bits that were not part of the first transmission. As shown in FIG. 4B, the second transmission (using a second redundancy version) can be defined to have a start point relatively close to an end of the circular buffer, but still aligned to the shift sizes. Information block or systematic portion can be denoted by S, and parity check bits can be denoted by p.

In one example, the second redundancy version can be defined as follows:

$$k_0 = \left( z \cdot \left\lceil \frac{3 \cdot N_{cb}}{4 \cdot z} \right\rceil \right),$$

assuming the first transmission can transmit at least 75% of the bits stored in the soft buffer of the UE. In another example, the second redundancy version can be defined to start at the beginning of the parity-check portion, $k_0 = K$, where K is the number of information bits encoded by the LDPC parity-check code used to encode the code block segment.

Figure 5:
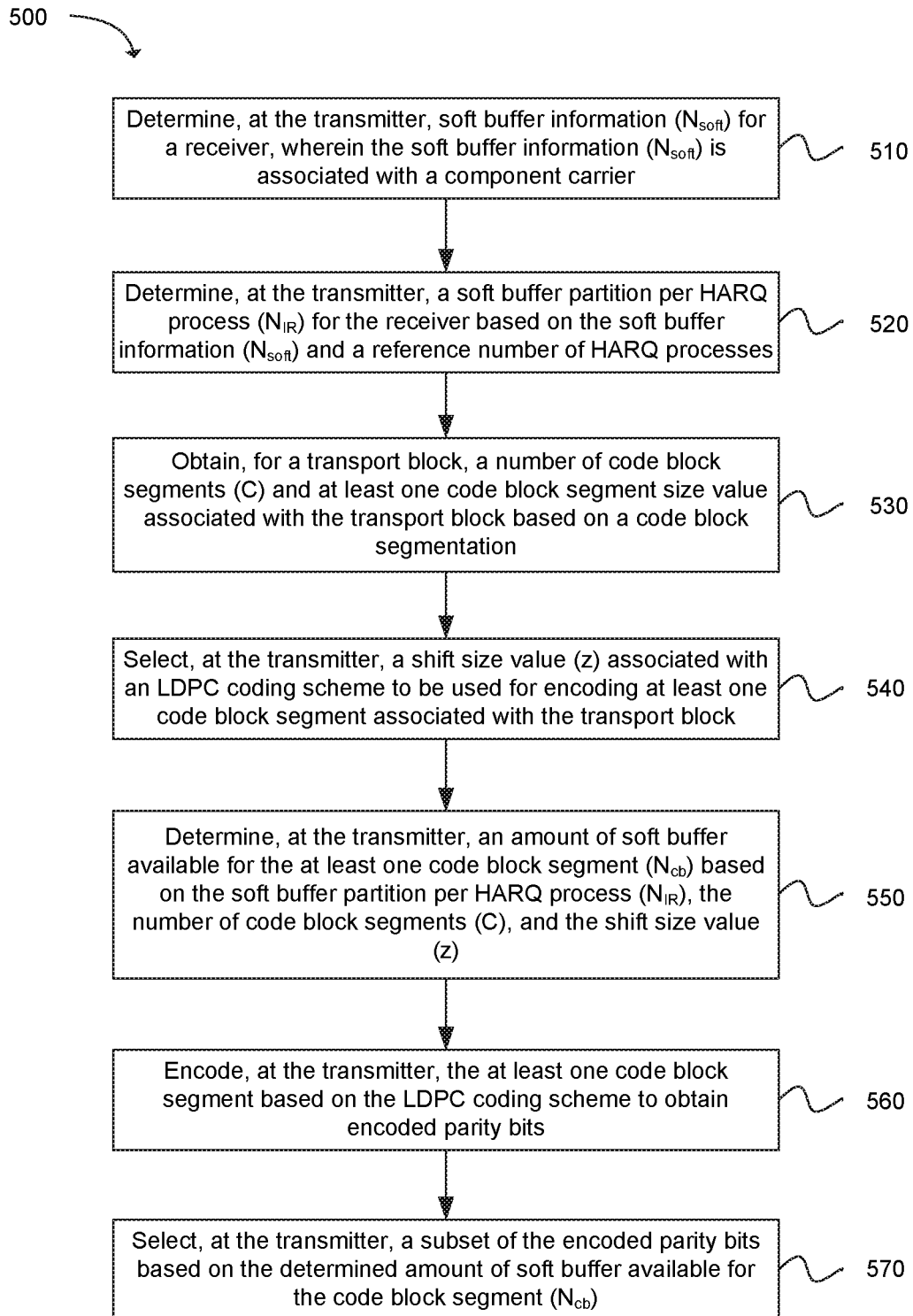
FIG. 5 depicts functionality of a transmitter operable to perform data transmissions using low density parity check (LDPC) codes in accordance with an example.

Another example provides functionality 500 of a transmitter operable to perform data transmissions using low density parity check (LDPC) coding, as shown in FIG. 5. The transmitter can comprise one or more processors and memory configured to: determine, at the transmitter, soft buffer information ($N_{soft}$) for a receiver, wherein the soft buffer information ($N_{soft}$) is associated with a component carrier, as in block 510. The transmitter can comprise one or more processors and memory configured to: determine, at the transmitter, a soft buffer partition per HARQ process ($N_{IR}$) for the receiver based on the soft buffer information ($N_{soft}$) and a reference number of HARQ processes, as in block 520. The transmitter can comprise one or more processors and memory configured to: obtain, for a transport block, a number of code block segments (C) and at least one code block segment size value associated with the transport block based on a code block segmentation, as in block 530. The transmitter can comprise one or more processors and memory configured to: select, at the transmitter, a shift size value (z) associated with an LDPC coding scheme to be used for encoding at least one code block segment associated with the transport block, as in block 540. The transmitter can comprise one or more processors and memory configured to: determine, at the transmitter, an amount of soft buffer available for the at least one code block segment ($N_{cb}$) based on the soft buffer partition per HARQ process ($N_{IR}$), the number of code block segments (C), and the shift size value (z), as in block 550. The transmitter can comprise one or more processors and memory configured to: encode, at the eNodeB, the at least one code block segment based on the LDPC coding scheme to obtain encoded parity bits, as in block 560. The transmitter can comprise one or more processors and memory configured to: select, at the transmitter, a subset of the encoded parity bits based on the determined amount of soft buffer available for the at least one code block segment ($N_{cb}$), as in block 570.

Figure 6:
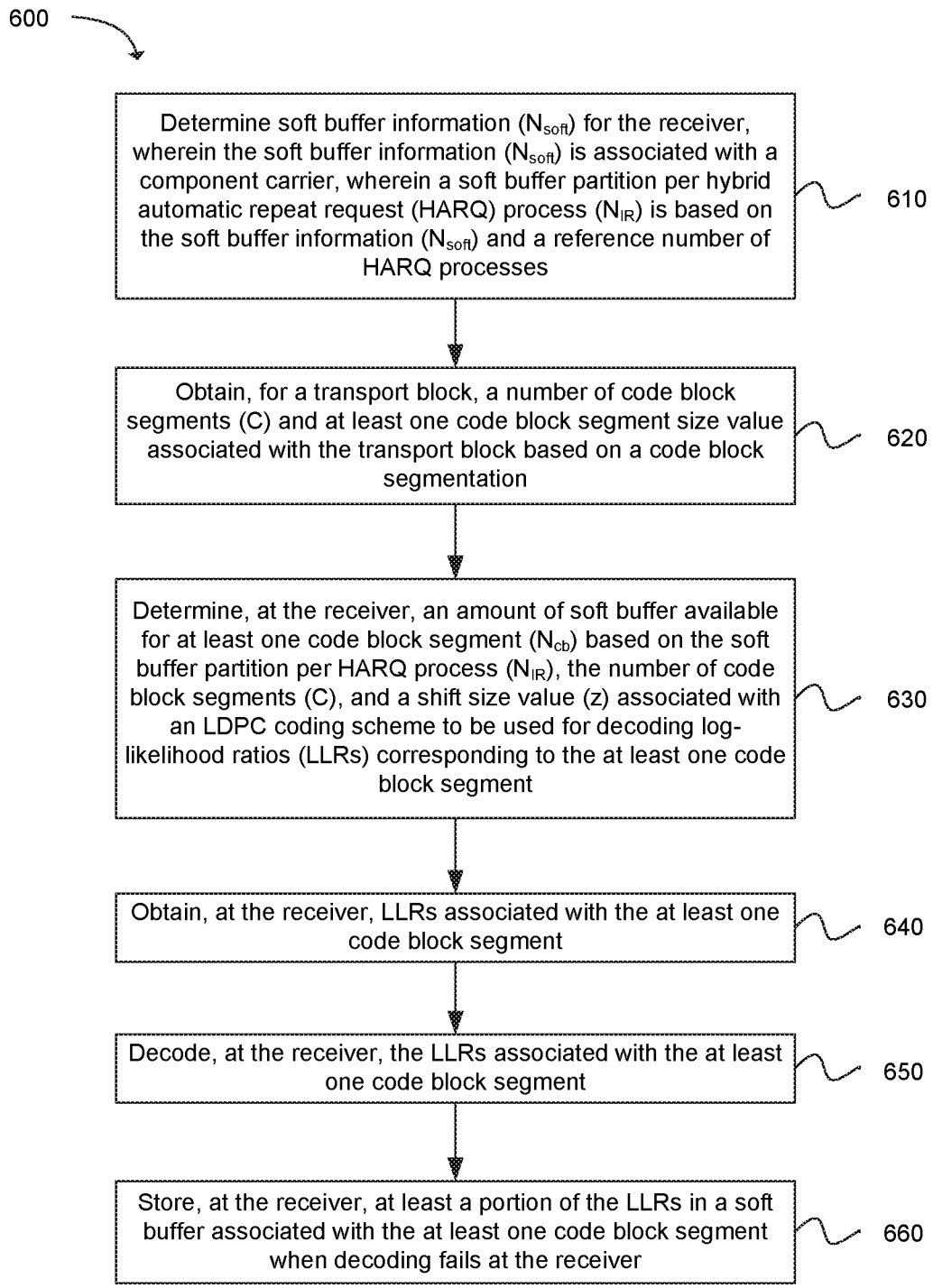
FIG. 6 depicts functionality of a receiver operable to perform data receptions using low density parity check (LDPC) codes in accordance with an example.

Another example provides functionality 600 of a receiver operable to perform data receptions using low density parity check (LDPC) codes, as shown in FIG. 6. The receiver can comprise one or more processors and memory configured to: determine soft buffer information ($N_{soft}$) for the receiver, wherein the soft buffer information ($N_{soft}$) is associated with a component carrier, wherein a soft buffer partition per hybrid automatic repeat request (HARQ) process ($N_{IR}$) is based on the soft buffer information ($N_{soft}$) and a reference number of HARQ processes, as in block 610. The receiver can comprise one or more processors and memory configured to: obtain, for a transport block, a number of code block segments (C) and at least one code block segment size value associated with the transport block based on a code block segmentation, as in block 620. The receiver can comprise one or more processors and memory configured to: determine, at the receiver, an amount of soft buffer available for at least one code block segment ($N_{cb}$) based on the soft buffer partition per HARQ process ($N_{IR}$), the number of code block segments (C), and a shift size value (z) associated with an LDPC coding scheme to be used for decoding log-likelihood ratios (LLRs) corresponding to the at least one code block segment, as in block 630. The receiver can comprise one or more processors and memory configured to: obtain, at the receiver, LLRs associated with the at least one code block segment, as in block 640. The receiver can comprise one or more processors and memory configured to: decode, at the receiver, the LLRs associated with the at least one code block segment, as in block 650. The receiver can comprise one or more processors and memory configured to: store, at the receiver, at least a portion of the LLRs in a soft buffer associated with the at least one code block segment when decoding fails at the receiver, as in block 660.

Figure 7:
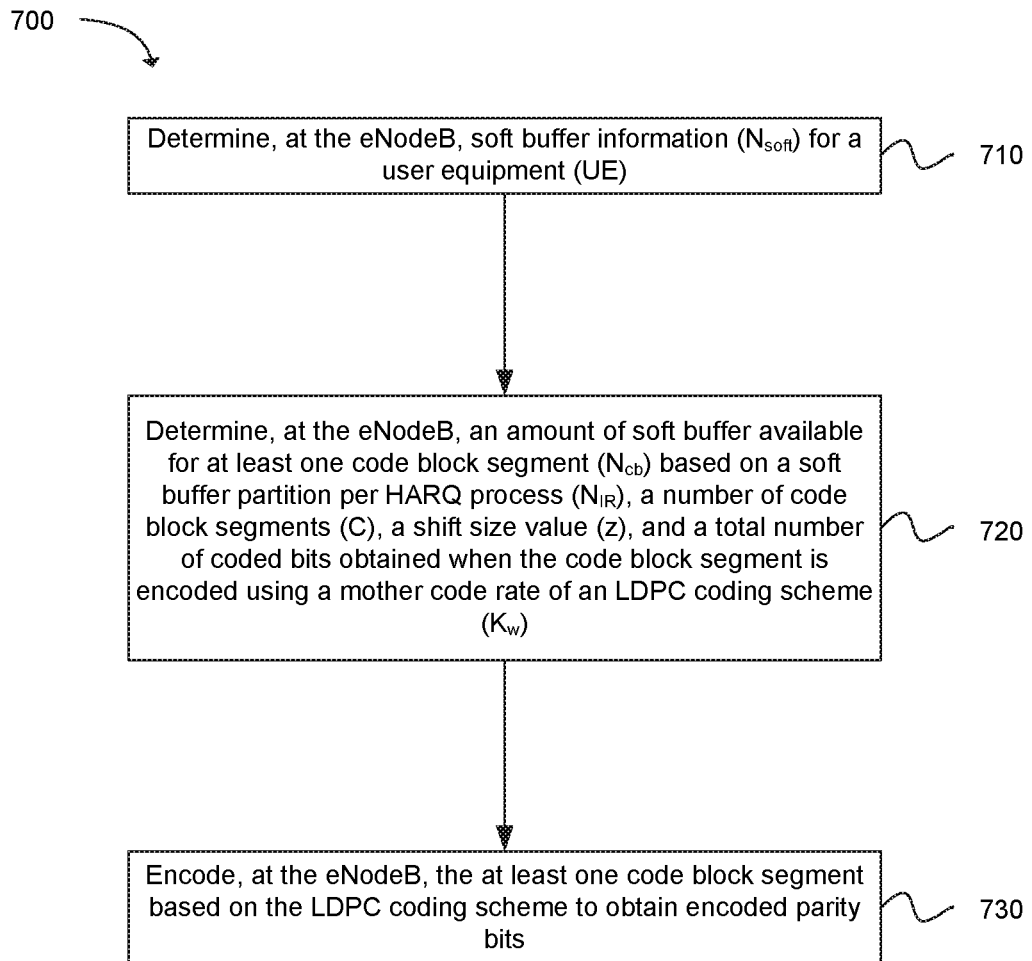
FIG. 7 depicts functionality of an eNodeB operable to perform data transmissions using low density parity check (LDPC) codes in accordance with an example.

Another example provides functionality 700 of an eNodeB operable to perform data transmissions using low density parity check (LDPC) codes, as shown in FIG. 7. The eNodeB can comprise one or more processors and memory configured to: determine, at the eNodeB, soft buffer information ($N_{soft}$) for a user equipment (UE), as in block 710. The eNodeB can comprise one or more processors and memory configured to: determine, at the eNodeB, an amount of soft buffer available for at least one code block segment ($N_{cb}$) based on a soft buffer partition per HARQ process ($N_{IR}$), a number of code block segments (C), a shift size value (z), and a total number of coded bits obtained when the code block segment is encoded using a mother code rate of the LDPC coding scheme ($K_w$), as in block 720. The eNodeB can comprise one or more processors and memory configured to: encode, at the eNodeB, the at least one code block segment based on the LDPC coding scheme to obtain encoded parity bits, as in block 730.

Figure 8:
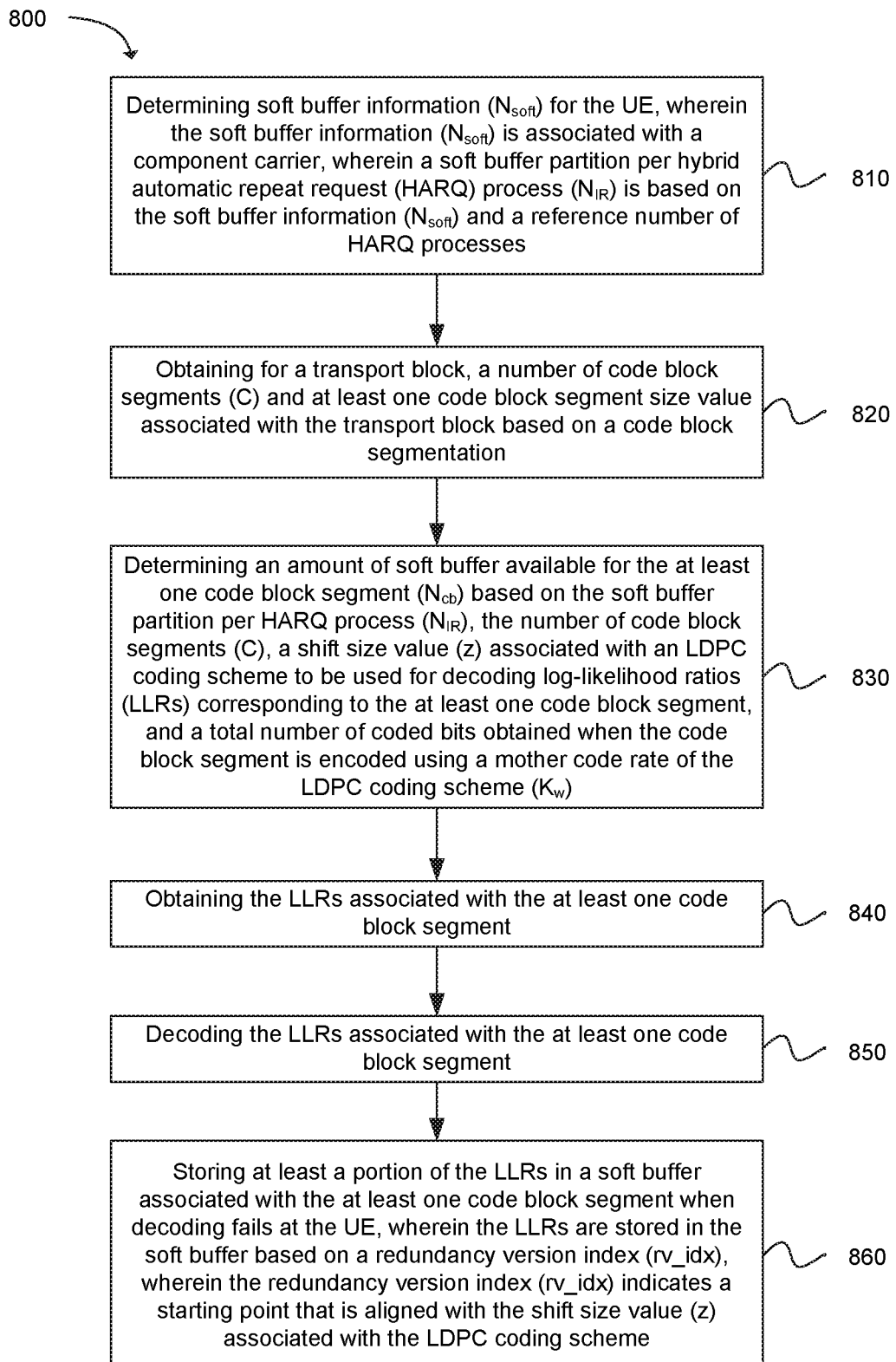
FIG. 8 depicts a flowchart of a machine readable storage medium having instructions embodied thereon for performing data receptions using low density parity check (LDPC) codes in accordance with an example.

Another example provides at least one machine readable storage medium having instructions 800 embodied thereon for performing data receptions using low density parity check (LDPC) codes, as shown in FIG. 8. The instructions can be executed on a machine, where the instructions are included on at least one computer readable medium or one non-transitory machine readable storage medium. The instructions when executed perform: determining, using one or more processors, at the UE, soft buffer information ($N_{soft}$) for the UE, wherein the soft buffer information ($N_{soft}$) is associated with a component carrier, wherein a soft buffer partition per hybrid automatic repeat request (HARQ) process ($N_{IR}$) is based on the soft buffer information ($N_{soft}$) and a reference number of HARQ processes, as in block 810. The instructions when executed perform: obtaining, using the one or more processors at the UE, for a transport block, a number of code block segments (C) and at least one code block segment size value associated with the transport block based on a code block segmentation, as in block 820. The instructions when executed perform: determining, using the one or more processors at the UE, an amount of soft buffer available for the at least one code block segment ($N_{cb}$) based on the soft buffer partition per HARQ process ($N_{IR}$), the number of code block segments (C), a shift size value (z) associated with an LDPC coding scheme to be used for decoding log-likelihood ratios (LLRs) corresponding to the at least one code block segment, and a total number of coded bits obtained when the code block segment is encoded using a mother code rate of the LDPC coding scheme ($K_w$), as in block 830. The instructions when executed perform: obtaining, using the one or more processors at the UE, the LLRs associated with the at least one code block segment, as in block 840. The instructions when executed perform: decoding, using the one or more processors at the UE, the LLRs associated with the at least one code block segment, as in block 850. The instructions when executed perform: storing, using the one or more processors at the UE, at least a portion of the LLRs in a soft buffer associated with the at least one code block segment when decoding fails at the UE, wherein the LLRs are stored in the soft buffer based on a redundancy version index (rv_idx), wherein the redundancy version index (rv_idx) indicates a starting point that is aligned with the shift size value (z) associated with the LDPC coding scheme, as in block 860.

Figure 9:
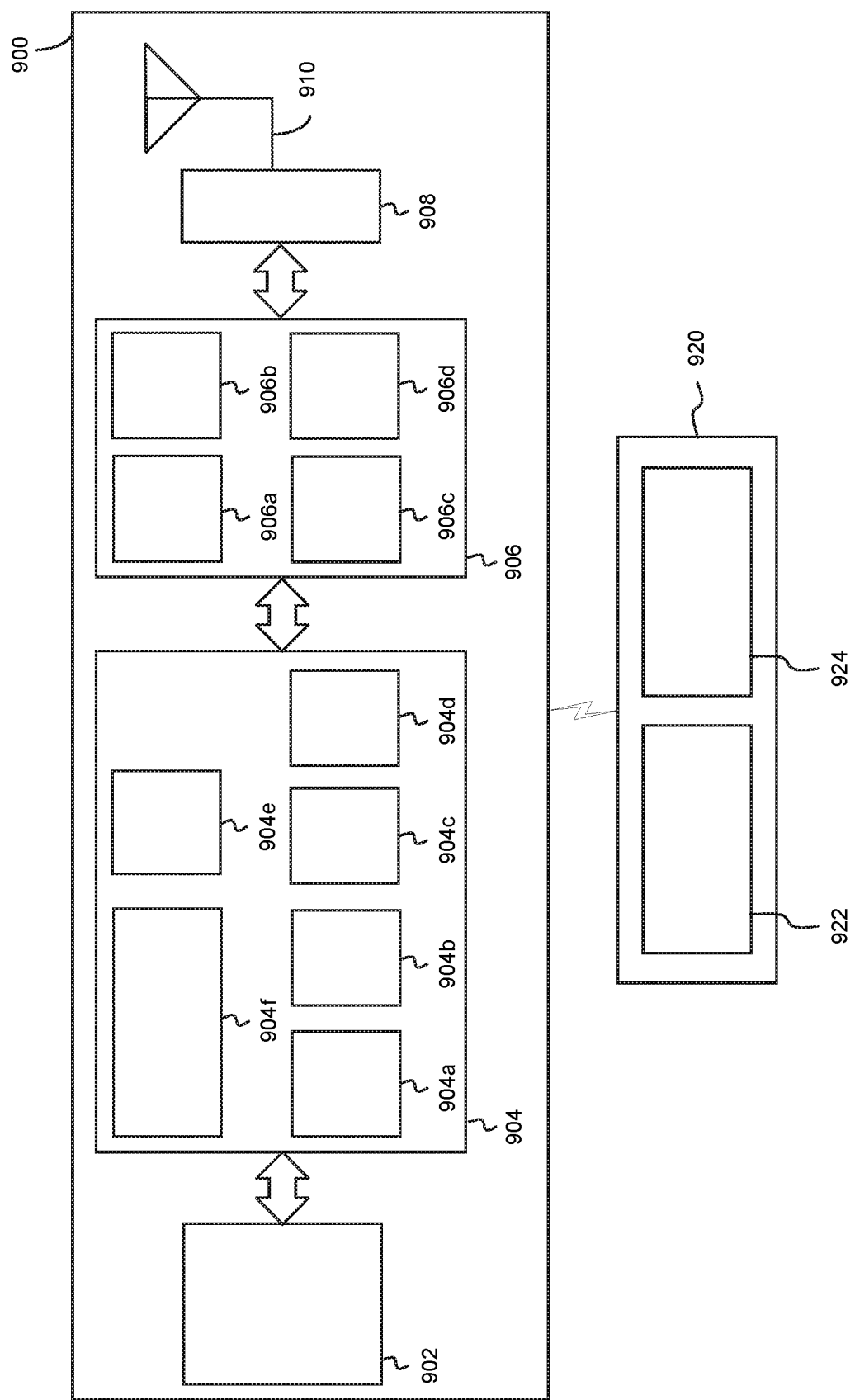
FIG. 9 illustrates a diagram of a wireless device (e.g., UE) and a base station (e.g., eNodeB) in accordance with an example.

FIG. 9 provides an example illustration of a user equipment (UE) device 900 and a node 920. The UE device 900 can include a wireless device, a mobile station (MS), a mobile wireless device, a mobile communication device, a tablet, a handset, or other type of wireless device. The UE device 900 can include one or more antennas configured to communicate with the node 920 or transmission station, such as a base station (BS), an evolved Node B (eNB), a baseband unit (BBU), a remote radio head (RRH), a remote radio equipment (RRE), a relay station (RS), a radio equipment (RE), a remote radio unit (RRU), a central processing module (CPM), or other type of wireless wide area network (WWAN) access point. The node 920 can include one or more processors 922 and memory 924. The UE device 900 can be configured to communicate using at least one wireless communication standard including 3GPP LTE, WiMAX, High Speed Packet Access (HSPA), Bluetooth, and WiFi. The UE device 900 can communicate using separate antennas for each wireless communication standard or shared antennas for multiple wireless communication standards. The UE device 900 can communicate in a wireless local area network (WLAN), a wireless personal area network (WPAN), and/or a WWAN.

In some embodiments, the UE device 900 may include application circuitry 902, baseband circuitry 904, Radio Frequency (RF) circuitry 906, front-end module (FEM) circuitry 908 and one or more antennas 910, coupled together at least as shown. In addition, the node 920 may include, similar to that described for the UE device 900, application circuitry, baseband circuitry, Radio Frequency (RF) circuitry, front-end module (FEM) circuitry and one or more antennas The application circuitry 902 may include one or more application processors. For example, the application circuitry 902 may include circuitry such as, but not limited to, one or more single-core or multi-core processors. The processor(s) may include any combination of general-purpose processors and dedicated processors (e.g., graphics processors, application processors, etc.). The processors may be coupled with and/or may include a storage medium, and may be configured to execute instructions stored in the storage medium to enable various applications and/or operating systems to run on the system.

The baseband circuitry 904 may include circuitry such as, but not limited to, one or more single-core or multi-core processors. The baseband circuitry 904 may include one or more baseband processors and/or control logic to process baseband signals received from a receive signal path of the RF circuitry 906 and to generate baseband signals for a transmit signal path of the RF circuitry 906. Baseband processing circuitry 904 may interface with the application circuitry 902 for generation and processing of the baseband signals and for controlling operations of the RF circuitry 906. For example, in some embodiments, the baseband circuitry 904 may include a second generation (2G) baseband processor 904a, third generation (3G) baseband processor 904b, fourth generation (4G) baseband processor 904c, and/or other baseband processor(s) 904d for other existing generations, generations in development or to be developed in the future (e.g., fifth generation (5G), 6G, etc.). The baseband circuitry 904 (e.g., one or more of baseband processors 904a-d) may handle various radio control functions that enable communication with one or more radio networks via the RF circuitry 906. The radio control functions may include, but are not limited to, signal modulation/demodulation, encoding/decoding, radio frequency shifting, etc. In some embodiments, modulation/demodulation circuitry of the baseband circuitry 904 may include Fast-Fourier Transform (FFT), precoding, and/or constellation mapping/demapping functionality. In some embodiments, encoding/decoding circuitry of the baseband circuitry 904 may include convolution, tail-biting convolution, turbo, Viterbi, and/or Low Density Parity Check (LDPC) encoder/decoder functionality. Embodiments of modulation/demodulation and encoder/decoder functionality are not limited to these examples and may include other suitable functionality in other embodiments.

In some embodiments, the baseband circuitry 904 may include elements of a protocol stack such as, for example, elements of an evolved universal terrestrial radio access network (EUTRAN) protocol including, for example, physical (PHY), media access control (MAC), radio link control (RLC), packet data convergence protocol (PDCP), and/or radio resource control (RRC) elements. A central processing unit (CPU) 904e of the baseband circuitry 904 may be configured to run elements of the protocol stack for signaling of the PHY, MAC, RLC, PDCP and/or RRC layers. In some embodiments, the baseband circuitry may include one or more audio digital signal processor(s) (DSP) 904f The audio DSP(s) 104f may be include elements for compression/decompression and echo cancellation and may include other suitable processing elements in other embodiments. Components of the baseband circuitry may be suitably combined in a single chip, a single chipset, or disposed on a same circuit board in some embodiments. In some embodiments, some or all of the constituent components of the baseband circuitry 904 and the application circuitry 902 may be implemented together such as, for example, on a system on a chip (SOC).

In some embodiments, the baseband circuitry 904 may provide for communication compatible with one or more radio technologies. For example, in some embodiments, the baseband circuitry 904 may support communication with an evolved universal terrestrial radio access network (EU-TRAN) and/or other wireless metropolitan area networks (WMAN), a wireless local area network (WLAN), a wireless personal area network (WPAN). Embodiments in which the baseband circuitry 904 is configured to support radio communications of more than one wireless protocol may be referred to as multi-mode baseband circuitry.

The RF circuitry 906 may enable communication with wireless networks using modulated electromagnetic radiation through a non-solid medium. In various embodiments, the RF circuitry 906 may include switches, filters, amplifiers, etc. to facilitate the communication with the wireless network. RF circuitry 906 may include a receive signal path which may include circuitry to down-convert RF signals received from the FEM circuitry 908 and provide baseband signals to the baseband circuitry 904. RF circuitry 906 may also include a transmit signal path which may include circuitry to up-convert baseband signals provided by the baseband circuitry 904 and provide RF output signals to the FEM circuitry 908 for transmission.

In some embodiments, the RF circuitry 906 may include a receive signal path and a transmit signal path. The receive signal path of the RF circuitry 906 may include mixer circuitry 906a, amplifier circuitry 906b and filter circuitry 906c. The transmit signal path of the RF circuitry 906 may include filter circuitry 906c and mixer circuitry 906a. RF circuitry 906 may also include synthesizer circuitry 906d for synthesizing a frequency for use by the mixer circuitry 906a of the receive signal path and the transmit signal path. In some embodiments, the mixer circuitry 906a of the receive signal path may be configured to down-convert RF signals received from the FEM circuitry 908 based on the synthesized frequency provided by synthesizer circuitry 906d. The amplifier circuitry 906b may be configured to amplify the down-converted signals and the filter circuitry 906c may be a low-pass filter (LPF) or band-pass filter (BPF) configured to remove unwanted signals from the down-converted signals to generate output baseband signals. Output baseband signals may be provided to the baseband circuitry 904 for further processing. In some embodiments, the output baseband signals may be zero-frequency baseband signals, although this is not a necessity. In some embodiments, mixer circuitry 906a of the receive signal path may comprise passive mixers, although the scope of the embodiments is not limited in this respect.

In some embodiments, the mixer circuitry 906a of the transmit signal path may be configured to up-convert input baseband signals based on the synthesized frequency provided by the synthesizer circuitry 906d to generate RF output signals for the FEM circuitry 908. The baseband signals may be provided by the baseband circuitry 904 and may be filtered by filter circuitry 906c. The filter circuitry 906c may include a low-pass filter (LPF), although the scope of the embodiments is not limited in this respect.

In some embodiments, the mixer circuitry 906a of the receive signal path and the mixer circuitry 906a of the transmit signal path may include two or more mixers and may be arranged for quadrature down-conversion and/or up-conversion respectively. In some embodiments, the mixer circuitry 906a of the receive signal path and the mixer circuitry 906a of the transmit signal path may include two or more mixers and may be arranged for image rejection (e.g., Hartley image rejection). In some embodiments, the mixer circuitry 906a of the receive signal path and the mixer circuitry 906a may be arranged for direct down-conversion and/or direct up-conversion, respectively. In some embodiments, the mixer circuitry 906a of the receive signal path and the mixer circuitry 906a of the transmit signal path may be configured for super-heterodyne operation.

In some embodiments, the output baseband signals and the input baseband signals may be analog baseband signals, although the scope of the embodiments is not limited in this respect. In some alternate embodiments, the output baseband signals and the input baseband signals may be digital baseband signals. In these alternate embodiments, the RF circuitry 906 may include analog-to-digital converter (ADC) and digital-to-analog converter (DAC) circuitry and the baseband circuitry 904 may include a digital baseband interface to communicate with the RF circuitry 906.

In some dual-mode embodiments, a separate radio IC circuitry may be provided for processing signals for each spectrum, although the scope of the embodiments is not limited in this respect.

In some embodiments, the synthesizer circuitry 906d may be a fractional-N synthesizer or a fractional N/N+1 synthesizer, although the scope of the embodiments is not limited in this respect as other types of frequency synthesizers may be suitable. For example, synthesizer circuitry 906d may be a delta-sigma synthesizer, a frequency multiplier, or a synthesizer comprising a phase-locked loop with a frequency divider.

The synthesizer circuitry 906d may be configured to synthesize an output frequency for use by the mixer circuitry 906a of the RF circuitry 906 based on a frequency input and a divider control input. In some embodiments, the synthesizer circuitry 906d may be a fractional N/N+1 synthesizer.

In some embodiments, frequency input may be provided by a voltage controlled oscillator (VCO), although that is not a necessity. Divider control input may be provided by either the baseband circuitry 904 or the applications processor 902 depending on the desired output frequency. In some embodiments, a divider control input (e.g., N) may be determined from a look-up table based on a channel indicated by the applications processor 902.

Synthesizer circuitry 906d of the RF circuitry 906 may include a divider, a delay-locked loop (DLL), a multiplexer and a phase accumulator. In some embodiments, the divider may be a dual modulus divider (DMD) and the phase accumulator may be a digital phase accumulator (DPA). In some embodiments, the DMD may be configured to divide the input signal by either N or N+1 (e.g., based on a carry out) to provide a fractional division ratio. In some example embodiments, the DLL may include a set of cascaded, tunable, delay elements, a phase detector, a charge pump and a D-type flip-flop. In these embodiments, the delay elements may be configured to break a VCO period up into Nd equal packets of phase, where Nd is the number of delay elements in the delay line. In this way, the DLL provides negative feedback to help ensure that the total delay through the delay line is one VCO cycle.

In some embodiments, synthesizer circuitry 906d may be configured to generate a carrier frequency as the output frequency, while in other embodiments, the output frequency may be a multiple of the carrier frequency (e.g., twice the carrier frequency, four times the carrier frequency) and used in conjunction with quadrature generator and divider circuitry to generate multiple signals at the carrier frequency with multiple different phases with respect to each other. In some embodiments, the output frequency may be a LO frequency (fLO). In some embodiments, the RF circuitry 906 may include an IQ/polar converter.

FEM circuitry 908 may include a receive signal path which may include circuitry configured to operate on RF signals received from one or more antennas 910, amplify the received signals and provide the amplified versions of the received signals to the RF circuitry 906 for further processing. FEM circuitry 908 may also include a transmit signal path which may include circuitry configured to amplify signals for transmission provided by the RF circuitry 906 for transmission by one or more of the one or more antennas 910.

In some embodiments, the FEM circuitry 908 may include a TX/RX switch to switch between transmit mode and receive mode operation. The FEM circuitry may include a receive signal path and a transmit signal path. The receive signal path of the FEM circuitry may include a low-noise amplifier (LNA) to amplify received RF signals and provide the amplified received RF signals as an output (e.g., to the RF circuitry 906). The transmit signal path of the FEM circuitry 908 may include a power amplifier (PA) to amplify input RF signals (e.g., provided by RF circuitry 906), and one or more filters to generate RF signals for subsequent transmission (e.g., by one or more of the one or more antennas 910.

Figure 10:
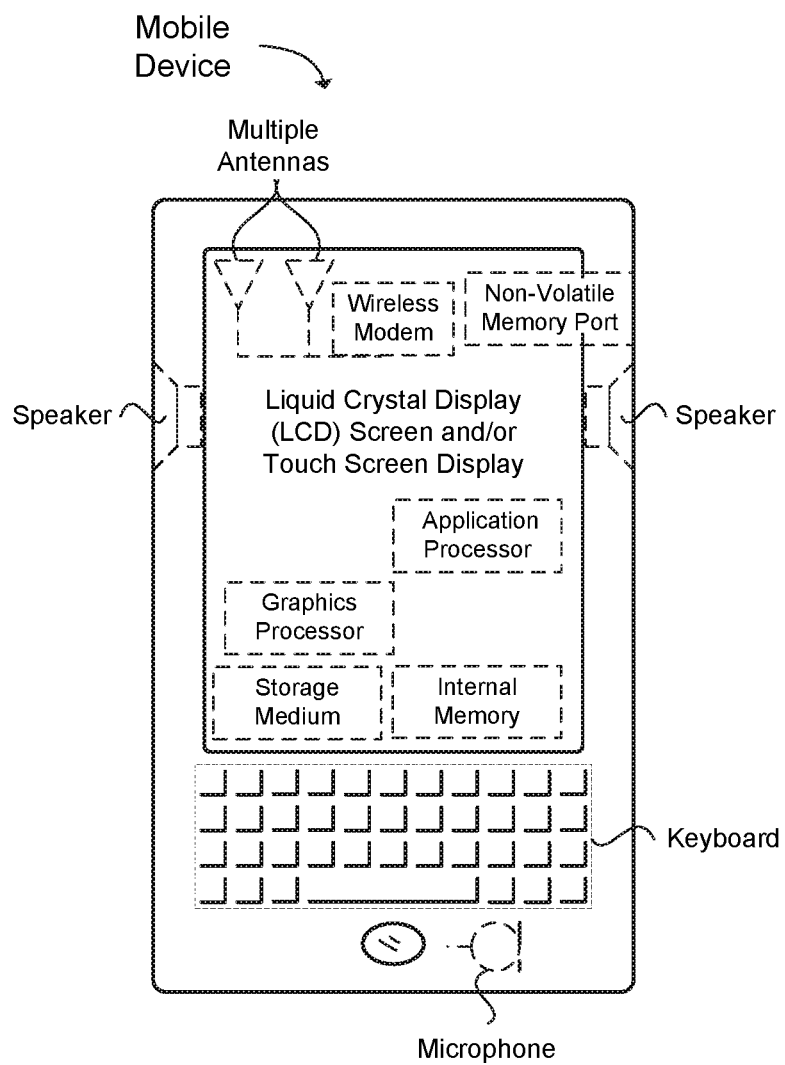
FIG. 10 illustrates a diagram of a wireless device (e.g., UE) in accordance with an example.

FIG. 10 provides an example illustration of the wireless device, such as a user equipment (UE), a mobile station (MS), a mobile wireless device, a mobile communication device, a tablet, a handset, or other type of wireless device. The wireless device can include one or more antennas configured to communicate with a node, macro node, low power node (LPN), or, transmission station, such as a base station (BS), an evolved Node B (eNB), a baseband processing unit (BBU), a remote radio head (RRH), a remote radio equipment (RRE), a relay station (RS), a radio equipment (RE), or other type of wireless wide area network (WWAN) access point. The wireless device can be configured to communicate using at least one wireless communication standard such as, but not limited to, 3GPP LTE, WiMAX, High Speed Packet Access (HSPA), Bluetooth, and WiFi. The wireless device can communicate using separate antennas for each wireless communication standard or shared antennas for multiple wireless communication standards. The wireless device can communicate in a wireless local area network (WLAN), a wireless personal area network (WPAN), and/or a WWAN. The wireless device can also comprise a wireless modem. The wireless modem can comprise, for example, a wireless radio transceiver and baseband circuitry (e.g., a baseband processor). The wireless modem can, in one example, modulate signals that the wireless device transmits via the one or more antennas and demodulate signals that the wireless device receives via the one or more antennas.

FIG. 10 also provides an illustration of a microphone and one or more speakers that can be used for audio input and output from the wireless device. The display screen can be a liquid crystal display (LCD) screen, or other type of display screen such as an organic light emitting diode (OLED) display. The display screen can be configured as a touch screen. The touch screen can use capacitive, resistive, or another type of touch screen technology. An application processor and a graphics processor can be coupled to internal memory to provide processing and display capabilities. A non-volatile memory port can also be used to provide data input/output options to a user. The non-volatile memory port can also be used to expand the memory capabilities of the wireless device. A keyboard can be integrated with the wireless device or wirelessly connected to the wireless device to provide additional user input. A virtual keyboard can also be provided using the touch screen.

Examples

The following examples pertain to specific technology embodiments and point out specific features, elements, or actions that can be used or otherwise combined in achieving such embodiments.

Example 1 includes an apparatus of a transmitter operable to perform data transmissions using low density parity check (LDPC) coding, the apparatus comprising one or more processors and memory configured to: determine, at the transmitter, soft buffer information ($N_{soft}$) for a receiver, wherein the soft buffer information ($N_{soft}$) is associated with a component carrier; determine, at the transmitter, a soft buffer partition per HARQ process ($N_{IR}$) for the receiver based on the soft buffer information ($N_{soft}$) and a reference number of HARQ processes; obtain, for a transport block, a number of code block segments (C) and at least one code block segment size value associated with the transport block based on a code block segmentation; select, at the transmitter, a shift size value (Z) associated with an LDPC coding scheme to be used for encoding at least one code block segment associated with the transport block; determine, at the transmitter, an amount of soft buffer available for the at least one code block segment ($N_{cb}$) based on the soft buffer partition per HARQ process ($N_{IR}$), the number of code block segments (C), and the shift size value (z); encode, at the transmitter, the at least one code block segment based on the LDPC coding scheme to obtain encoded parity bits; and select, at the transmitter, a subset of the encoded parity bits based on the determined amount of soft buffer available for the code block segment ($N_{cb}$).

Example 2 includes the apparatus of Example 1, further comprising a transceiver configured to transmit the subset of encoded parity bits to the receiver using the component carrier.

Example 3 includes the apparatus of any of Examples 1 to 2, wherein the one or more processors and memory are further configured to determine the amount of soft buffer available for the at least one code block segment ($N_{cb}$) based on the following:

$$N_{cb} = \min\left(z \cdot \left\lfloor \frac{N_{IR}}{C \cdot z} \right\rfloor, K_w\right),$$

wherein $K_w$ indicates a total number of coded bits obtained when the code block segment is encoded using a mother code rate of the LDPC coding scheme.

Example 4 includes the apparatus of any of Examples 1 to 3, wherein the mother code rate of the LDPC coding scheme is 1/3.

Example 5 includes the apparatus of any of Examples 1 to 4, wherein the one or more processors and memory are further configured to select the subset of the encoded parity bits based on a redundancy version index (rv_idx).

Example 6 includes the apparatus of any of Examples 1 to 5, wherein the redundancy version index ($rv_{idx}$) indicates a starting point ($k_0$) that is aligned with the shift size value (z)

associated with the LDPC coding scheme, and $rv_{idx}$ is included in a set of redundancy version indexes.

Example 7 includes the apparatus of any of Examples 1 to 6, wherein the starting point is defined as:

$$k_0 = \left(z \cdot \left\lceil \frac{N_{cb}}{N_{RV} \cdot z} \right\rceil \cdot rv_{idx}\right),$$

wherein $N_{RV}$ indicates a number of redundancy versions supported in the set of redundancy version indexes.

Example 8 includes the apparatus of any of Examples 1 to 7, wherein: the reference number of HARQ processes is a maximum number of HARQ processes supported for reception by the receiver on the component carrier; or the reference number of HARQ processes is a fixed value.

Example 9 includes the apparatus of any of Examples 1 to 8, wherein the soft buffer information ($N_{soft}$) is predetermined based on receiver category information indicated by the receiver.

Example 10 includes the apparatus of any of Examples 1 to 9, wherein the soft buffer information ($N_{soft}$) indicates a total amount of memory available for storing soft channel bits for supporting multiple hybrid automatic repeat request (HARQ) processes at the receiver.

Example 11 includes the apparatus of any of Examples 1 to 10, wherein the transmitter includes an eNodeB and the receiver includes a user equipment (UE).

Example 12 includes an apparatus of a receiver operable to perform data receptions using low density parity check (LDPC) codes, the apparatus comprising one or more processors and memory configured to: determine soft buffer information ($N_{soft}$) for the receiver, wherein the soft buffer information ($N_{soft}$) is associated with a component carrier, wherein a soft buffer partition per hybrid automatic repeat request (HARQ) process ($N_{IR}$) is based on the soft buffer information ($N_{soft}$) and a reference number of HARQ processes; obtain, for a transport block, a number of code block segments (C) and at least one code block segment size value associated with the transport block based on a code block segmentation; determine, at the receiver, an amount of soft buffer available for at least one code block segment ($N_{cb}$) based on the soft buffer partition per HARQ process ($N_{IR}$), the number of code block segments (C), and a shift size value (z) associated with an LDPC coding scheme to be used for decoding log-likelihood ratios (LLRs) corresponding to the at least one code block segment; obtain, at the receiver, LLRs associated with the at least one code block segment; decode, at the receiver, the LLRs associated with the at least one code block segment; and store, at the receiver, at least a portion of the LLRs in a soft buffer associated with the at least one code block segment when decoding fails at the receiver.

Example 13 includes the apparatus of Example 12, wherein the one or more processors and memory are further configured to determine the amount of soft buffer available for the at least one code block segment ($N_{cb}$) based on the following:

$$N_{cb} = \min\left(z \cdot \left\lfloor \frac{N_{IR}}{C \cdot z} \right\rfloor, K_w\right),$$

wherein $K_w$ indicates a total number of coded bits obtained when the code block segment is encoded using a mother code rate of the LDPC coding scheme.

Example 14 includes the apparatus of any of Examples 12 to 13, wherein the mother code rate of the LDPC coding scheme is 1/3.

Example 15 includes the apparatus of any of Examples 12 to 14, wherein the one or more processors and memory are further configured to store the LLRs in the soft buffer based on a redundancy version index (rv_idx).

Example 16 includes the apparatus of any of Examples 12 to 15, wherein the redundancy version index (rv_idx) indicates a starting point that is aligned with the shift size value (z) associated with the LDPC coding scheme, and the redundancy version index (rv_idx) is included in a set of redundancy version indexes.

Example 17 includes the apparatus of any of Examples 12 to 16, wherein the starting point is defined as:

$$k_0 = \left(z \cdot \left\lceil \frac{N_{cb}}{N_{RV} \cdot z} \right\rceil \cdot rv_{idx}\right),$$

wherein $N_{RV}$ indicates a number of redundancy versions supported in the set of redundancy version indexes.

Example 18 includes the apparatus of any of Examples 12 to 17, wherein: the reference number of HARQ processes is a maximum number of HARQ processes supported for reception by the receiver on the component carrier; or the reference number of HARQ processes is a fixed value.

Example 19 includes the apparatus of any of Examples 12 to 18, wherein the soft buffer information ($N_{soft}$) is predetermined based on receiver category information indicated by the receiver.

Example 20 includes an apparatus of an eNodeB operable to perform data transmissions using low density parity check (LDPC) codes, the apparatus comprising one or more processors and memory configured to: determine, at the eNodeB, soft buffer information ($N_{soft}$) for a user equipment (UE); determine, at the eNodeB, an amount of soft buffer available for at least one code block segment ($N_{cb}$) based on a soft buffer partition per HARQ process ($N_{IR}$), a number of code block segments (C), a shift size value (z), and a total number of coded bits obtained when the code block segment is encoded using a mother code rate of the LDPC coding scheme ($K_w$); and encode, at the eNodeB, the at least one code block segment based on the LDPC coding scheme to obtain encoded parity bits.

Example 21 includes the apparatus of Example 20, wherein the one or more processors and memory are further configured to: determine, at the eNodeB, the soft buffer partition per hybrid automatic repeat request (HARQ) process ($N_{IR}$) for the UE based on the soft buffer information ($N_{soft}$) and a reference number of HARQ processes; obtain, for a transport block, the number of code block segments (C) and at least one code block segment size value associated with the transport block based on a code block segmentation; select, at the eNodeB, the shift size value (Z) associated with an LDPC coding scheme to be used for encoding at least one code block segment associated with the transport block; and select, at the eNodeB, a subset of the encoded parity bits based on the determined amount of soft buffer available for the code block segment ($N_{cb}$) and a redundancy version index (rv_idx), wherein the redundancy version index (rv_idx) indicates a starting point that is aligned with the shift size value (z) associated with the LDPC coding scheme.

Example 22 includes the apparatus of any of Examples 20-21, further comprising a transceiver configured to transmit the subset of encoded parity bits to the UE using the component carrier.

Example 23 includes the apparatus of any of Examples 20 to 22, wherein the one or more processors and memory are further configured to determine the amount of soft buffer available for the at least one code block segment ($N_{cb}$) based on the following:

$$N_{cb} = \min\left(z \cdot \left\lfloor \frac{N_{IR}}{C \cdot z} \right\rfloor, K_w\right),$$

wherein $K_w$ indicates a total number of coded bits obtained when the code block segment is encoded using a mother code rate of the LDPC coding scheme.

Example 24 includes the apparatus of any of Examples 20 to 23, wherein: the mother code rate of the LDPC coding scheme is 1/3; or the starting point is defined as:

$$k_0 = \left(z \cdot \left\lceil \frac{N_{cb}}{N_{RV} \cdot z} \right\rceil \cdot rv_{idx}\right),$$

wherein $N_{RV}$ indicates a number of redundancy versions supported in a set of redundancy version indexes; or the reference number of HARQ processes is a maximum number of HARQ processes supported for reception by the UE on the component carrier; or the soft buffer information ($N_{soft}$) is predetermined based on UE category information indicated by the UE.

Example 25 includes at least one machine readable storage medium having instructions embodied thereon for performing data receptions using low density parity check (LDPC) codes, the instructions when executed perform the following: determining, using one or more processors at the UE, soft buffer information ($N_{soft}$) for the UE, wherein the soft buffer information ($N_{soft}$) is associated with a component carrier, wherein a soft buffer partition per hybrid automatic repeat request (HARQ) process ($N_{IR}$) is based on the soft buffer information ($N_{soft}$) and a reference number of HARQ processes; obtaining, using the one or more processors at the UE, for a transport block, a number of code block segments (C) and at least one code block segment size value associated with the transport block based on a code block segmentation; determining, using the one or more processors at the UE, an amount of soft buffer available for the at least one code block segment ($N_{cb}$) based on the soft buffer partition per HARQ process ($N_{IR}$), the number of code block segments (C), a shift size value (z) associated with an LDPC coding scheme to be used for decoding log-likelihood ratios (LLRs) corresponding to the at least one code block segment, and a total number of coded bits obtained when the code block segment is encoded using a mother code rate of the LDPC coding scheme ($K_w$); obtaining, using the one or more processors at the UE, the LLRs associated with the at least one code block segment; decoding, using the one or more processors at the UE, the LLRs associated with the at least one code block segment; and storing, using the one or more processors at the UE, at least a portion of the LLRs in a soft buffer associated with the at least one code block segment when decoding fails at the UE, wherein the LLRs are stored in the soft buffer based on a redundancy version index (rv_idx), wherein the redundancy version index (rv_idx) indicates a starting point that is aligned with the shift size value (z) associated with the LDPC coding scheme.

Example 26 includes the at least one machine readable storage medium of Example 25, wherein the one or more processors and memory are further configured to determine the amount of soft buffer available for the at least one code block segment ($N_{cb}$) based on the following:

$$N_{cb} = \min\left(z \cdot \left\lfloor \frac{N_{IR}}{C \cdot z} \right\rfloor, K_w\right),$$

wherein $K_w$ indicates a total number of coded bits obtained when the code block segment is encoded using a mother code rate of the LDPC coding scheme.

Example 27 includes the at least one machine readable storage medium of any of Examples 25 to 26, wherein: the mother code rate of the LDPC coding scheme is 1/3; or the starting point is defined as:

$$k_0 = \left(z \cdot \left\lceil \frac{N_{cb}}{N_{RV} \cdot z} \right\rceil \cdot rv_{idx}\right),$$

wherein $N_{RV}$ indicates a number of redundancy versions supported in a set of redundancy version indexes; or the reference number of HARQ processes is a maximum number of HARQ processes supported for reception by the UE on the component carrier; or the soft buffer information ($N_{soft}$) is predetermined based on UE category information indicated by the UE.

Example 28 includes a user equipment (UE) operable to perform data receptions using low density parity check (LDPC) codes, the UE comprising: means for determining, using one or more processors at the UE, soft buffer information ($N_{soft}$) for the UE, wherein the soft buffer information ($N_{soft}$) is associated with a component carrier, wherein a soft buffer partition per hybrid automatic repeat request (HARQ) process ($N_{IR}$) is based on the soft buffer information ($N_{soft}$) and a reference number of HARQ processes; means for obtaining, using the one or more processors at the UE, for a transport block, a number of code block segments (C) and at least one code block segment size value associated with the transport block based on a code block segmentation; means for determining, using the one or more processors at the UE, an amount of soft buffer available for at least one code block segment ($N_{cb}$) based on the soft buffer partition per HARQ process ($N_{IR}$), the number of code block segments (C), a shift size value (z) associated with an LDPC coding scheme to be used for decoding log-likelihood ratios (LLRs) corresponding to the at least one code block segment, and a total number of coded bits obtained when the code block segment is encoded using a mother code rate of the LDPC coding scheme ($K_w$); means for obtaining, using the one or more processors at the UE, the LLRs associated with the at least one code block segment; means for decoding, using the one or more processors at the UE, the LLRs associated with the at least one code block segment; and means for storing, using the one or more processors at the UE, at least a portion of the LLRs in a soft buffer associated with the at least one code block segment when decoding fails at the UE, wherein the LLRs are stored in the soft buffer based on a redundancy version index ($rv_{idx}$), wherein the redundancy version index ($rv_{idx}$)

indicates a starting point that is aligned with the shift size value (z) associated with the LDPC coding scheme.

Example 29 includes the UE of Example 28, further comprising means for determining the amount of soft buffer available for the at least one code block segment ($N_{cb}$) based on the following:

$$N_{cb} = \min\left(z \cdot \left\lfloor \frac{N_{IR}}{C \cdot z} \right\rfloor, K_w\right),$$

wherein $K_w$ indicates a total number of coded bits obtained when the code block segment is encoded using a mother code rate of the LDPC coding scheme.

Example 30 includes the UE of any of Examples 28 to 29, wherein: the mother code rate of the LDPC coding scheme is 1/3; or the starting point is defined as:

$$k_0 = \left(z \cdot \left\lceil \frac{N_{cb}}{N_{RV} \cdot z} \right\rceil \cdot rv_{idx}\right),$$

wherein $N_{RV}$ indicates a number of redundancy versions supported in a set of redundancy version indexes; or the reference number of HARQ processes is a maximum number of HARQ processes supported for reception by the UE on the component carrier; or the soft buffer information ($N_{soft}$) is predetermined based on UE category information indicated by the UE.

Various techniques, or certain aspects or portions thereof, may take the form of program code (i.e., instructions) embodied in tangible media, such as floppy diskettes, compact disc-read-only memory (CD-ROMs), hard drives, non-transitory computer readable storage medium, or any other machine-readable storage medium wherein, when the program code is loaded into and executed by a machine, such as a computer, the machine becomes an apparatus for practicing the various techniques. A non-transitory computer readable storage medium can be a computer readable storage medium that does not include signal. In the case of program code execution on programmable computers, the computing device may include a processor, a storage medium readable by the processor (including volatile and non-volatile memory and/or storage elements), at least one input device, and at least one output device. The volatile and non-volatile memory and/or storage elements may be a random-access memory (RAM), erasable programmable read only memory (EPROM), flash drive, optical drive, magnetic hard drive, solid state drive, or other medium for storing electronic data. The node and wireless device may also include a transceiver module (i.e., transceiver), a counter module (i.e., counter), a processing module (i.e., processor), and/or a clock module (i.e., clock) or timer module (i.e., timer). In one example, selected components of the transceiver module can be located in a cloud radio access network (C-RAN). One or more programs that may implement or utilize the various techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware.

It should be understood that many of the functional units described in this specification have been labeled as modules, in order to more particularly emphasize their implementation independence. For example, a module may be implemented as a hardware circuit comprising custom very-large-scale integration (VLSI) circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions, which may, for instance, be organized as an object, procedure, or function. Nevertheless, the executables of an identified module may not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. The modules may be passive or active, including agents operable to perform desired functions.

Reference throughout this specification to "an example" or "exemplary" means that a particular feature, structure, or characteristic described in connection with the example is included in at least one embodiment of the present technology. Thus, appearances of the phrases "in an example" or the word "exemplary" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present technology may be referred to herein along with alternatives for the various components thereof. It is understood that such embodiments, examples, and alternatives are not to be construed as defacto equivalents of one another, but are to be considered as separate and autonomous representations of the present technology.

Furthermore, the described features, structures, or characteristics may be combined in any suitable manner in one or more embodiments. In the following description, numerous specific details are provided, such as examples of layouts, distances, network examples, etc., to provide a thorough understanding of embodiments of the technology. One skilled in the relevant art will recognize, however, that the technology can be practiced without one or more of the specific details, or with other methods, components, layouts, etc. In other instances, well-known structures, materials, or operations are not shown or described in detail to avoid obscuring aspects of the technology.

While the forgoing examples are illustrative of the principles of the present technology in one or more particular applications, it will be apparent to those of ordinary skill in the art that numerous modifications in form, usage and details of implementation can be made without the exercise of inventive faculty, and without departing from the principles and concepts of the technology. Accordingly, it is not intended that the technology be limited, except as by the claims set forth below.

What is claimed is:

1. An apparatus of a transmitter operable to perform data transmissions using low density parity check (LDPC) coding, the apparatus comprising one or more processors and memory configured to:
   determine, at the transmitter, soft buffer information ($N_{soft}$) for a receiver, wherein the soft buffer information ($N_{soft}$) is associated with a component carrier;
   determine, at the transmitter, a soft buffer partition per HARQ process ($N_{IR}$) for the receiver based on the soft buffer information ($N_{soft}$) and a reference number of HARQ processes;
   obtain, for a transport block, a number of code block segments (C) and at least one code block segment size value associated with the transport block based on a code block segmentation;
   select, at the transmitter, a shift size value (z) associated with an LDPC coding scheme to be used for encoding at least one code block segment associated with the transport block;
   determine, at the transmitter, an amount of soft buffer available for the at least one code block segment ($N_{cb}$) based on the soft buffer partition per HARQ process ($N_{IR}$), the number of code block segments (C), and the shift size value (z);
   encode, at the transmitter, the at least one code block segment based on the LDPC coding scheme to obtain encoded parity bits; and
   select, at the transmitter, a subset of the encoded parity bits based on the determined amount of soft buffer available for the at least one code block segment ($N_{cb}$).

2. The apparatus of claim 1, further comprising a transceiver configured to transmit the subset of encoded parity bits to the receiver using the component carrier.

3. The apparatus of claim 1, wherein the one or more processors and memory are further configured to determine the amount of soft buffer available for the at least one code block segment ($N_{cb}$) based on the following:

$$N_{cb} = \min\left(z \cdot \left\lfloor \frac{N_{IR}}{C \cdot z} \right\rfloor, K_w\right),$$

wherein $K_w$ indicates a total number of coded bits obtained when the code block segment is encoded using a mother code rate of the LDPC coding scheme.

4. The apparatus of claim 3, wherein the mother code rate of the LDPC coding scheme is 1/3.

5. The apparatus of claim 1, wherein the one or more processors and memory are further configured to select the subset of the encoded parity bits based on a redundancy version index ($rv_{idx}$).

6. The apparatus of claim 5, wherein the redundancy version index ($rv_{idx}$) indicates a starting point ($k_0$) that is aligned with the shift size value (z) associated with the LDPC coding scheme, and $rv_{idx}$ is included in a set of redundancy version indexes.

7. The apparatus of claim 6, wherein the starting point is defined as:

$$k_0 = \left(z \cdot \left\lceil \frac{N_{cb}}{N_{RV} \cdot z} \right\rceil \cdot rv_{idx}\right),$$

wherein $N_{RV}$ indicates a number of redundancy versions supported in the set of redundancy version indexes.

8. The apparatus of claim 1, wherein:
   the reference number of HARQ processes is a maximum number of HARQ processes supported for reception by the receiver on the component carrier; or
   the reference number of HARQ processes is a fixed value.

9. The apparatus of claim 1, wherein the soft buffer information ($N_{soft}$) is predetermined based on receiver category information indicated by the receiver.

10. The apparatus of claim 1, wherein the soft buffer information ($N_{soft}$) indicates a total amount of memory available for storing soft channel bits for supporting multiple hybrid automatic repeat request (HARQ) processes at the receiver.

11. The apparatus of claim 1, wherein the transmitter includes an eNodeB and the receiver includes a user equipment (UE).

12. An apparatus of a receiver operable to perform data receptions using low density parity check (LDPC) codes, the apparatus comprising one or more processors and memory configured to:
   determine soft buffer information ($N_{soft}$) for the receiver, wherein the soft buffer information ($N_{soft}$) is associated with a component carrier, wherein a soft buffer partition per hybrid automatic repeat request (HARQ) process ($N_{IR}$) is based on the soft buffer information ($N_{soft}$) and a reference number of HARQ processes;
   obtain, for a transport block, a number of code block segments (C) and at least one code block segment size value associated with the transport block based on a code block segmentation;
   determine, at the receiver, an amount of soft buffer available for at least one code block segment ($N_{cb}$) based on the soft buffer partition per HARQ process ($N_{IR}$), the number of code block segments (C), and a shift size value (z) associated with an LDPC coding scheme to be used for decoding log-likelihood ratios (LLRs) corresponding to the at least one code block segment;
   obtain, at the receiver, LLRs associated with the at least one code block segment;
   decode, at the receiver, the LLRs associated with the at least one code block segment; and store, at the receiver, at least a portion of the LLRs in a soft buffer associated with the at least one code block segment when decoding fails at the receiver.

13. The apparatus of claim 12, wherein the one or more processors and memory are further configured to determine the amount of soft buffer available for the at least one code block segment ($N_{cb}$) based on the following:

$$N_{cb} = \min\left(z \cdot \left\lfloor \frac{N_{IR}}{C \cdot z} \right\rfloor, K_w \right),$$

wherein $K_w$ indicates a total number of coded bits obtained when the code block segment is encoded using a mother code rate of the LDPC coding scheme.

14. The apparatus of claim 13, wherein the mother code rate of the LDPC coding scheme is 1/3.

15. The apparatus of claim 12, wherein the one or more processors and memory are further configured to store the LLRs in the soft buffer based on a redundancy version index ($rv_{idx}$).

16. The apparatus of claim 15, wherein the redundancy version index ($rv_{idx}$) indicates a starting point that is aligned with the shift size value (z) associated with the LDPC coding scheme, and the redundancy version index ($rv_{idx}$) is included in a set of redundancy version indexes.

17. The apparatus of claim 16, wherein the starting point is defined as:

$$k_0 = \left(z \cdot \left\lceil \frac{N_{cb}}{N_{RV} \cdot z} \right\rceil \cdot rv_{idx} \right),$$

wherein $N_{RV}$ indicates a number of redundancy versions supported in the set of redundancy version indexes.

18. The apparatus of claim 12, wherein:
the reference number of HARQ processes is a maximum number of HARQ processes supported for reception by the receiver on the component carrier; or
the reference number of HARQ processes is a fixed value.

19. The apparatus of claim 12, wherein the soft buffer information ($N_{soft}$) is predetermined based on receiver category information indicated by the receiver.

20. An apparatus of an eNodeB operable to perform data transmissions using low density parity check (LDPC) codes, the apparatus comprising one or more processors and memory configured to:
determine, at the eNodeB, soft buffer information ($N_{soft}$) for a user equipment (UE);
determine, at the eNodeB, an amount of soft buffer available for at least one code block segment ($N_{cb}$) based on a soft buffer partition per HARQ process ($N_{IR}$), a number of code block segments (C), a shift size value (z), and a total number of coded bits obtained when the code block segment is encoded using a mother code rate of an LDPC coding scheme ($K_w$); and
encode, at the eNodeB, the at least one code block segment based on the LDPC coding scheme to obtain encoded parity bits.

21. The apparatus of claim 20, wherein the one or more processors and memory are configured to:
determine, at the eNodeB, the soft buffer partition per hybrid automatic repeat request (HARQ) process (NO for the UE based on the soft buffer information ($N_{soft}$) and a reference number of HARQ processes;

obtain, for a transport block, the number of code block segments (C) and at least one code block segment size value associated with the transport block based on a code block segmentation;
select, at the eNodeB, the shift size value (z) associated with the LDPC coding scheme to be used for encoding the at least one code block segment associated with the transport block; and
select, at the eNodeB, a subset of the encoded parity bits based on the determined amount of soft buffer available for the at least one code block segment ($N_{cb}$) and a redundancy version index ($rv_{idx}$), wherein the redundancy version index ($rv_{idx}$) indicates a starting point that is aligned with the shift size value (z) associated with the LDPC coding scheme.

22. The apparatus of claim 21, further comprising a transceiver configured to transmit the subset of encoded parity bits to the UE using a component carrier.

23. The apparatus of claim 21, wherein the one or more processors and memory are further configured to determine the amount of soft buffer available for the at least one code block segment ($N_{cb}$) based on the following:

$$N_{cb} = \min\left(z \cdot \left\lfloor \frac{N_{IR}}{C \cdot z} \right\rfloor, K_w \right),$$

wherein $K_w$ indicates a total number of coded bits obtained when the code block segment is encoded using a mother code rate of the LDPC coding scheme.

24. The apparatus of claim 21, wherein:
the mother code rate of the LDPC coding scheme is 1/3; or
the starting point is defined as:

$$k_0 = \left(z \cdot \left\lceil \frac{N_{cb}}{N_{RV} \cdot z} \right\rceil \cdot rv_{idx} \right),$$

wherein $N_{RV}$ indicates a number of redundancy versions supported in a set of redundancy version indexes; or
the reference number of HARQ processes is a maximum number of HARQ processes supported for reception by the UE on a component carrier; or
the soft buffer information ($N_{soft}$) is predetermined based on UE category information indicated by the UE.

25. At least one non-transitory machine readable storage medium having instructions embodied thereon for performing data receptions using low density parity check (LDPC) codes, the instructions when executed perform the following:
determining, using one or more processors at the UE, soft buffer information ($N_{soft}$) for the UE, wherein the soft buffer information ($N_{soft}$) is associated with a component carrier, wherein a soft buffer partition per hybrid automatic repeat request (HARQ) process ($N_{IR}$) is based on the soft buffer information ($N_{soft}$) and a reference number of HARQ processes;
obtaining, using the one or more processors at the UE, for a transport block, a number of code block segments (C) and at least one code block segment size value associated with the transport block based on a code block segmentation;
determining, using the one or more processors at the UE, an amount of soft buffer available for at least one code block segment ($N_{cb}$) based on the soft buffer partition per HARQ process ($N_{IR}$), the number of code block segments (C), a shift size value (z) associated with an LDPC coding scheme to be used for decoding log-likelihood ratios (LLRs) corresponding to the at least one code block segment, and a total number of coded bits obtained when the code block segment is encoded using a mother code rate of the LDPC coding scheme ($K_w$);

obtaining, using the one or more processors at the UE, the LLRs associated with the at least one code block segment;

decoding, using the one or more processors at the UE, the LLRs associated with the at least one code block segment; and storing, using the one or more processors at the UE, at least a portion of the LLRs in a soft buffer associated with the at least one code block segment when decoding fails at the UE, wherein the LLRs are stored in the soft buffer based on a redundancy version index ($rv_{idx}$), wherein the redundancy version index ($rv_{idx}$) indicates a starting point that is aligned with the shift size value (z) associated with the LDPC coding scheme.

26. The at least one machine readable storage medium of claim 25, wherein the one or more processors and memory are further configured to determine the amount of soft buffer available for the at least one code block segment ($N_{cb}$) based on the following:

$$N_{cb} = \min\left(z \cdot \left\lfloor \frac{N_{IR}}{C \cdot z} \right\rfloor, K_w\right),$$

wherein $K_w$ indicates a total number of coded bits obtained when the code block segment is encoded using a mother code rate of the LDPC coding scheme.

27. The at least one machine readable storage medium of claim 25, wherein:
the mother code rate of the LDPC coding scheme is 1/3; or
the starting point is defined as:

$$k_0 = \left(z \cdot \left\lceil \frac{N_{cb}}{N_{RV} \cdot z} \right\rceil \cdot rv_{idx}\right),$$

wherein $N_{RV}$ indicates a number of redundancy versions supported in a set of redundancy version indexes; or
the reference number of HARQ processes is a maximum number of HARQ processes supported for reception by the UE on the component carrier; or
the soft buffer information ($N_{soft}$) is predetermined based on UE category information indicated by the UE.

* * * * *